United States Patent [19]

Sasaki et al.

[11] Patent Number: 5,084,905
[45] Date of Patent: Jan. 28, 1992

[54] THIN FILM TRANSISTOR PANEL AND MANUFACTURING METHOD THEREOF

[75] Inventors: Makoto Sasaki, Tokyo; Syunichi Sato, Kawagoe; Hisatoshi Mori, Fussa, all of Japan

[73] Assignee: Casio Computer Co., Ltd., Tokyo, Japan

[21] Appl. No.: 415,889

[22] Filed: Oct. 2, 1989

[30] Foreign Application Priority Data

| Oct. 26, 1988 | [JP] | Japan | 63-138620[U] |
| Nov. 18, 1988 | [JP] | Japan | 63-290123 |
| Nov. 28, 1988 | [JP] | Japan | 63-298349 |
| Dec. 28, 1988 | [JP] | Japan | 63-168460[U] |
| Dec. 28, 1988 | [JP] | Japan | 63-168461[U] |

[51] Int. Cl.⁵ .................................. H01L 23/48
[52] U.S. Cl. ............................... 357/71; 357/4;
    357/41; 357/45; 357/51; 357/55; 357/68;
    359/59
[58] Field of Search ............... 357/4, 41, 45, 51, 55, 357/68, 71; 359/59

[56] References Cited

U.S. PATENT DOCUMENTS

| 4,683,442 | 7/1987 | Vyne ......................... 357/51 |
| 4,748,490 | 5/1988 | Hollingsworth ............... 357/51 |
| 4,899,205 | 2/1990 | Hamdy et al. ................ 357/51 |

*Primary Examiner*—Edward J. Wojciechowicz
*Attorney, Agent, or Firm*—Frishauf, Holtz, Goodman & Woodward

[57] ABSTRACT

A thin film transistor panel has a substrate on which a plurality of electrode lines are aligned in a matrix form, thin film transistors which are formed on crossing portions of the plurality of the electrode lines, a diffusible insulating film for covering said thin film transistors, and metal-diffused layers and are connected to source electrodes. The metal-diffused layers are formed by diffusing a metal into predetermined areas of said insulating film. If the metal-diffused layers are used as the pixel electrodes, high density display can be obtained due to the fine pixel electrodes. In addition, a manufacturing method of thin film transistor panel having the steps of forming gate electrode on a substrate, forming gate insulating films on the gate electrodes, forming semiconductor layers on said gate insulating films, forming source and drain electrodes on said semiconductor layers except for channel portions, forming a diffusible insulating film which covers the whole surface of the substrate, providing contact holes in said insulating film corresponding to said source electrodes, and forming metal-diffused layers by diffusing a metal into the insulating film and inner surfaces of said contact holes. The metal-diffused areas can be formed in high pattern accuracy, and the fine pixel electrodes can be easily obtained if the metal-diffused areas are used as the pixel electrodes.

22 Claims, 15 Drawing Sheets

THIN FILM TRANSISTOR PANEL AND MANUFACTURING METHOD THEREOF

BACKGROUND OF THE INVENTION

1. Field of the Invention

The present invention relates to a liquid crystal display panel which is used as a display panel in a liquid crystal TV and the like, more particularly, to a thin film transistor panel which uses thin film transistors as switching devices for causing pixels in the panel turn-ON and turn-OFF.

2. Description of the Related Art

A thin film transistor panel which is used in active matrix type liquid crystal display device for displaying television image and the like is formed by aligning a large number of transparent pixel electrodes and a large number of thin film transistors for driving the pixel electrodes in row and column directions on a transparent substrate. Gate and drain electrodes of the thin film transistors are connected to gates and data lines which are wired between columns of the pixel electrodes, and source electrodes are connected to the transparent pixel electrodes.

A panel which is formed by aligning thin film transistors and pixel electrodes in row is widely known as the thin film transistor panel. However, it was proposed recently that the panel is constructed by forming thin transistors on the transparent substrate, then forming transparent insulating film thereon and then forming transparent pixel electrodes on the transparent insulating film. When the transparent insulating film is formed between the thin film transistors and the pixel electrodes, aperture ratio of liquid crystal display device can be improved due to large area of pixel electrodes since the short-circuit between the pixel electrodes and the gates and data lines can be prevented by the transparent insulating film even if the distance there between is reduced.

FIG. 1 is a schematic sectional view showing part of the conventional thin film transistor panel in which thin film transistors and formed on the transparent substrate, and transparent pixel electrodes are formed on the transparent insulating film.

Referring to FIG. 1, reference numeral 1 denotes a transparent substrate (glass plate); and T1, a thin film transistor formed on the transparent substrate 1. Thin film transistor T1 includes gate electrode 2 formed on transparent substrate 1, transparent gate insulating film 3 formed on gate electrode 2 and substantially all over substrate 1, i(intrinsic)-a(amolphus)-Si semiconductor layer 4 formed opposite to gate electrode 2 on gate insulating film 3, and source electrode 6 and drain electrode 7 both formed on semiconductor layer 4 through n+-a-Si layer 5. Gate electrode 2 is connected to the unshown gate line, and drain electrode 7 is connected the unshown data line. Flat surface transparent insulating film 8 composed of SOG (Spin On Glass) is formed substantially all over substrate 1 on which thin film transistor T1 has been formed. Transparent pixel electrode 10 is formed on transparent insulating film. Contact hole 9 is provided through transparent insulating film 8 correspondingly to source electrode 6. The edge portion of transparent pixel electrode 10 is formed so as to be overlapped contact hole 9. Electrode 10 is connected to the source electrode of thin film transistor T1 through contact metal 11 filled in contact hole 9.

The thin film transistor panel is manufactured by the following steps of: forming thin film transistors T1 on transparent substrate 1; forming transparent insulating film 8 thereon; providing contact holes 9 through transparent insulating film 8; despositing conductive metal on transparent insulating film 8 by plating or the like so as to fill contact metal 11 in contact hole 9; eliminating undesired portion of the metal film deposited on the surface of transparent insulating film 8 by etching; forming transparent conductive film composed of ITO and the like on transparent insulating film 8 by sputtering or the like; and then patterning the transparent conductive film so as to form transparent pixel electrodes 10.

However, in order to connect pixel electrodes 10 to source electrodes 6 of thin film transistors T1, the conventional thin film transistor panel has a drawback that a lot of steps of manufacturing the thin film transistor panel must be needed. Because, at first, conductive metal has to be deposited on transparent insulating film 8 so as to fill contact metal 11 in contact holes 9 and then transparent pixel electrodes 10 have to be formed on transparent insulating film 8 by eliminating undesired parts of the metal film on transparent insulating film 8 with etching. Furthermore, in case of connecting pixel electrodes 10 to source electrodes 6 by contact metal 11, it is necessary to fill completely contact holes 9 with contact metal 11 to the upper level (that is, to the surface of transparent insulating film 8) so as to connect securely pixel electrodes 10 to source electrodes 6. As a result, a metal used as contact metal 11 has to be deposited much thicker than the depth of contact holes 9 so as to deposite contact metals 11 in the whole depth of contact holes 9. It is preferable that transparent insulating film 8 may be constructed as thickly as possible in order to reduce the capacitance between pixel electrodes 10 and the gates and data lines under transparent insulating film 8. However, when transparent insulating film 8 is made to be thick, since the depth of contact holes 9 are provided through transparent insulating film 8, deposited thickness of the metal also become thick. In addition, in case a metal used as contact metal 11 is deposited on transparent insulting film 8 thickly, it takes a lot of time to deposit the metal and also it is difficult to eliminate the undesired metal film on transparent insulating film 8. Accordingly, the conventional thin film transistor panel has drawback that it is troublesome to manufacture the panel.

While, wirings of the thin film transistor panel are formed generally on the insulating film covering the thin film transistors and are connected to the electrodes of the thin film transistors through the contact holes provided through the insulating film.

FIG. 2 shows a part of a schematic sectional connecting structure of the wirings of the thin film transistor. More specifically, FIG. 2 shows a connecting structure of the wirings connected to the source and drain electrodes of an inveted stagger type thin film transistor. In FIG. 2, reference numeral 21 demotes an insulating substrate including a glass plate etc., and an inverted stagger type thin film transistor T2 is formed on insulating substrate 21. Inverted stagger type thin film transistor T2 is composed of gate electrode G formed on insulating substrate 21, gate insulating film 22 formed on gate electrode G, i-a-Si semiconductor layer 23 formed opposite to gate electrode G on gate insulating film 22, n+-a-Si layers 24 corresponding to source and drain areas formed on semiconductor layer 23 with covering channel portion, and source electrode S and drain electrode D formed on n+-a-Si layer 24. Gate electrode G is connected to the unshown gate line formed on substrate 21.

Insulating film 25 covering thin film transistor T2 is formed on substrate 21 on which thin film transistor T2 has been formed. Source electrode S and drain electrode D is connected to wirings 27 (source and drain wirings) formed on insulating film 25. Wirings 27 are formed by depositing metal such as Al on insulating film 25 by means of plating or sputtering, and then patterning the metal. The wiring metal is deposited to fill contact holes 26 which are formed correspondingly to source and drain electrodes S and D. Wirings 27 are connected to source electrode S and drain electrode D through contact metal layers 27a which is filled in contact hole 26.

The connecting structure of the wirings of the inverted stagger type thin film transistor is shown in FIG. 2. The wirings formed on the insulating film of stagger type, coplanar type and inverted coplanar type thin film transistors and also the transistor formed on the Si single crystal substrate are connected to the electrodes of the transistor in the same manner as described above.

However, in the connecting structure of the wirings of the thin film transistors, wirings 27 are connected to the electrodes (source and drain electrodes S and D in FIG. 2) of thin film transistors T2 through contact metal layers 27a. Therefore it is necessary to deposit the wiring metal satisfactorily thicker than the depth of contact holes 26 so as to connect certainly wirings 27 to the electrodes of thin film transistors T2. In general, deposited thickness of the wiring metal is set at almost two times of the depth of contact holes 26. It is preferable that insulating film 25 is formed as thickly as possible so as to reduce the capacitance between wirings 27 formed on film 25 and the gate wirings on substrate 21 and to prevent short-circuit between wirings 27 and the gate wirings. However, when insulating film 25 is formed thickly, the depth of contact holes 26 becomes large so that deposited thickness of the wiring metal also becomes large. As a result, the conventional connecting structure of wirings has the drawbacks that it requires a lot of time to deposit the wiring metal on insulating film 25, and that, when wiring 27 is formed by patterning the wiring metal film deposited on insulating film 25, the patterning of the wiring metal film is troublesome so that it is difficult to make wirings finely due to the large film thickness of the wiring metal film.

SUMMARY OF THE INVENTION

The present invention has been made in consideration of the above and, therefore, it is an object of the present invention to provide a thin film transistor panel which can be easily manufactured by employing an insulating material into which a metal can be diffused as the insulating film formed in the thin film transistor panel, and using such metal-diffused areas of the insulating film as the conductive electrodes.

The present invention has been made to achieve the above object, and there is provided a thin film transistor panel comprising a substrate on which a plurality of electrode lines are formed in matrix shape, thin film transistors each having at least a source electrode which is formed at crossing portions of the plurality of electrode lines, a diffusible insulating film for covering the thin film transistors, and metal-diffused layers which are formed by using the diffusion in the insulating film and are directly connected to the source electrodes electrically.

According to the present invention, the pixel electrodes of the thin film transistor panel are formed by the diffusion in the insulating film. As a result, the thin film transistor panel having fine pixel electrodes can be obtained by the present invention.

Also, a manufacturing method of the thin film transistor panel of present invention comprising the steps of, forming gate electrodes on a substrate, forming gate insulating films on the whole substrate including the gate electrodes, forming semiconductor layers on the gate insulating film on the locations opposite to the gate electrodes, forming source and drain electrodes on the semiconductor layers excluding the channel portions, forming a diffusible insulating film which covers the whole substrate, forming contact holes in the insulating film correspondingly to the source electrodes, and forming metal-diffused layers by diffusing a metal into the surface areas of the insulating film and inner surfaces of the contact holes.

According to the present invention, pixel electrodes are formed by means of metal diffusion in predetermined areas of the insulating film. As a result, the pixel electrodes can be easily and minutely formed in a high pattern accuracy.

BRIEF DESCRIPTION OF THE DRAWINGS

This invention can be more fully understood form the following detailed description when taken in conjunction with the accompanying drawings, in which.

DETAILED DESCRIPTION OF THE PREFERRED EMBODIMENTS

Preferred embodiments of the present invention will now be described with reference to the accompanying drawing.

Figure 1:
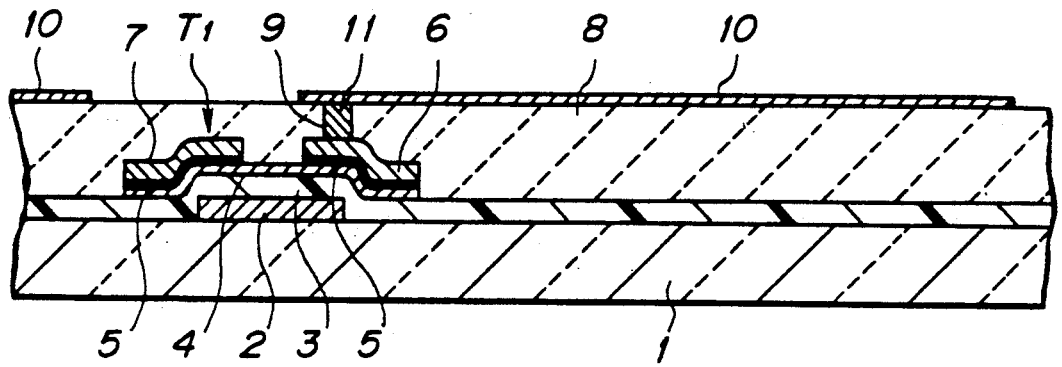
FIGS. 1 and 2 are schematic sectional views showing pertinent portions of a conventional thin film transistor panel.
Figure 3:
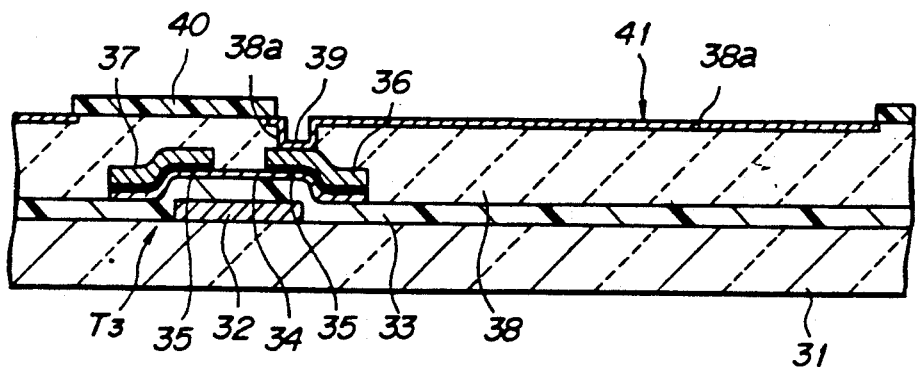
FIG. 3 is a schematic sectional view showing a pertinent portion of a thin film transistor panel according to an embodiment of the present invention.

FIG. 3 shows a sectional structure of a part of thin film transistor panel. In FIG. 3, reference symbol T3 denotes an inverted stagger type thin film transistor formed on transparent substrate 31. The description as to thin film transistor T3 is omitted since it has the same construction as that is formed in the conventional thin film transistor panel shown in FIG. 1. Reference numeral 38 denotes a transparent insulating film which is formed over transparent substrate 31 on which thin film transistor T3 has been formed. Insulating film 38 is formed substantially all over the surface of substrate 31 and has a substantially flat surface. Transparent insulating film 38 is made of a transparent insulating material such as SOG (Spin On Glass), into which a metal can be diffused and which is set to almost 1 μm in thickness. Contact hole 39 corresponding to source electrode 36 of thin film transistor T3 is provided in transparent insulating film 38. Contact hole 39 is a bottomed hole which does not reach the upper surface of electrode 36. The bottom of contact hole 39 is almost 400 Å in thickness. Reference numeral 40 denotes a diffusion preventive film which is formed on transparent insulating film 38 except for pixel electrode forming area where contact hole 39 is included. Diffusion preventive film 40 is provided so as to limit the diffusion area at the time when metal-diffused layer 38a, described later in detail, is formed by diffusing a metal into transparent insulating film 38. Therefore, diffusion preventive film 40 is made of the insulating material, e.g., SiN, into which it is difficult to diffuse a metal. Transparent metal-diffused layer 38a which is made by diffusing conductive metal made of ITO into transparent insulating film 38a is formed on the area in transparent insulating film 38 without diffusion preventive film 40. That is the layer 38a is formed on pixel electrode forming area including contact hole 39 all over the upper surface of transparent insulating film 38 and the inner surface of contact hole 39. Metal-diffused layer 38a on the upper surface of transparent insulating film 38 is used as transparent pixel electrode 41. This transparent pixel electrode 41 is connected to source electrode 36 of thin film transistor T3 by means of metal-diffusion layer 38a deposited on the inner surface of contact hole 39. In addition, metal-diffused layer 38a (diffusion depth to transparent insulating film 38) (almost 500 Å) is slightly thicker than the bottom of contact hole 39 (almost 400 Å). As a result, the bottom of contact hole 39 is connected conductively to source electrode 36 of thin film transistor T3 because the whole thickness acts as metal-diffused layer 38a.

Figure 4A:
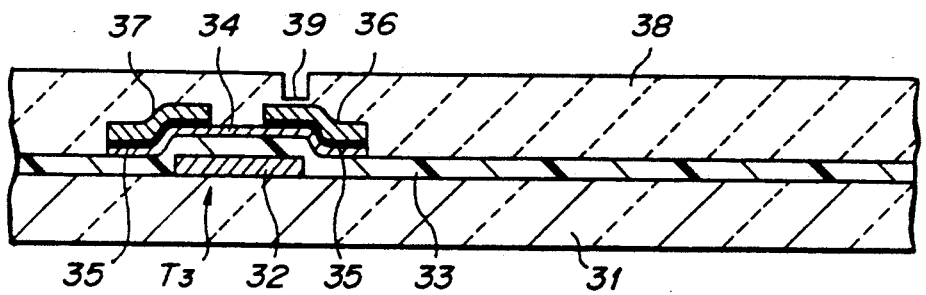
FIGS. 4A to 4C are schematic sectional views illustrating manufacturing steps of the thin film transistor panel according to the embodiment shown in FIG. 3.
Figure 4B:
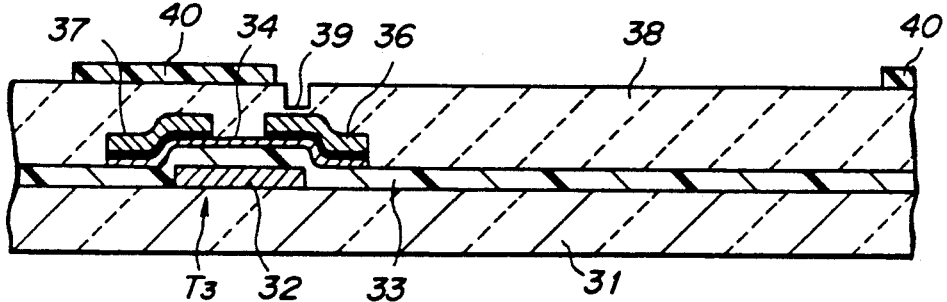
Figure 4C:
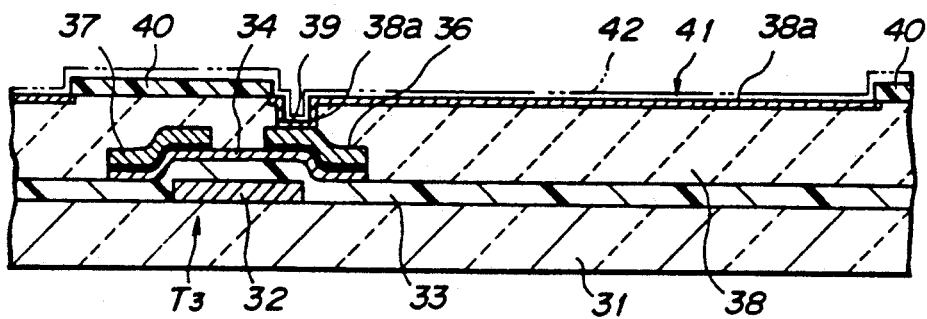

A manufacturing method of the thin film transistor panel, part of which is shown in FIG. 3, is described as follows. First, thin film transistors T3 are formed on transparent substrate 31 and then transparent insulating film (SOG film) 38 is formed by applying SOG on substrate 31 by almost 1 μm in thickness and burning it, as shown in FIG. 4A. Bottomed contact holes 39 corresponding to source electrodes 36 is formed by etching transparent insulting film 38. The bottom is almost 400 Å in thickness. Then, SiN is deposited on transparent insulating film 38 by means of plasma CVD process. Then diffusion preventive films (SiN films) 40 are formed by patterning the deposited SiN film, as shown in FIG. 4B. Films 40 cover transparent insulating film 38 except for the pixel electrode forming areas including contact holes 39. Then, ITO film 42 is deposited by sputtering ITO on diffusion preventive films 40 and transparent insulating film 38 and the inner surfaces of contact holes 39, as shown by a chain line in FIG. 4C. The ITO sputtering is performed at the substrate temperature of almost 300° C. When ITO sputtering is performed, ITO film 42 is being deposited all over the upper surface of transparent insulating film 38 and the whole inner surfaces of contact holes 39 and, at the same time, deposited ITO is being heat diffused into transparent insulating film 38 in the area uncovered by diffusion preventive film 40. As a result, metal-diffused layers 38a into which ITO is diffused are formed all over the upper surface of transparent insulating film 38 and the whole inner surfaces of contact holes 39, as shown in FIG. 4C. Since diffusion preventive films 40 are made of SiN into which a metal is difficult to be diffused, ITO diffusion into diffusion preventive films 40 scarcely occur. The ITO sputtering is performed to the level that the ITO diffusion depth in the bottoms of contact holes 39 for transparent insulating film 38 are in excess of the bottom thickness of contact holes 39 (almost 500 Å). Metal-diffused layers 38a which are formed on the surface of transparent insulating film 38 are used as transparent pixel electrodes 41 as they are, since metal-diffused layers 38a are transparent. Metal-diffused layers 38a formed in the inner surfaces of contact holes 39 are also used as the contact layers which connect transparent pixel electrodes 41 to source electrodes 36 of thin film transistors T3. In this case, when heat treatment for heating again substrate 31 at almost 300° C. is executed after ITO was diffused into transparent insulating film 38 by ITO sputtering, ITO can be diffused into transparent insulating film 38 more deeply so that conduction between metal-diffused layers 38a which are formed in the inner surface of contact holes 39 and source electrodes 36 of thin film transistors T3 can be obtained more certainly.

Figure 5:
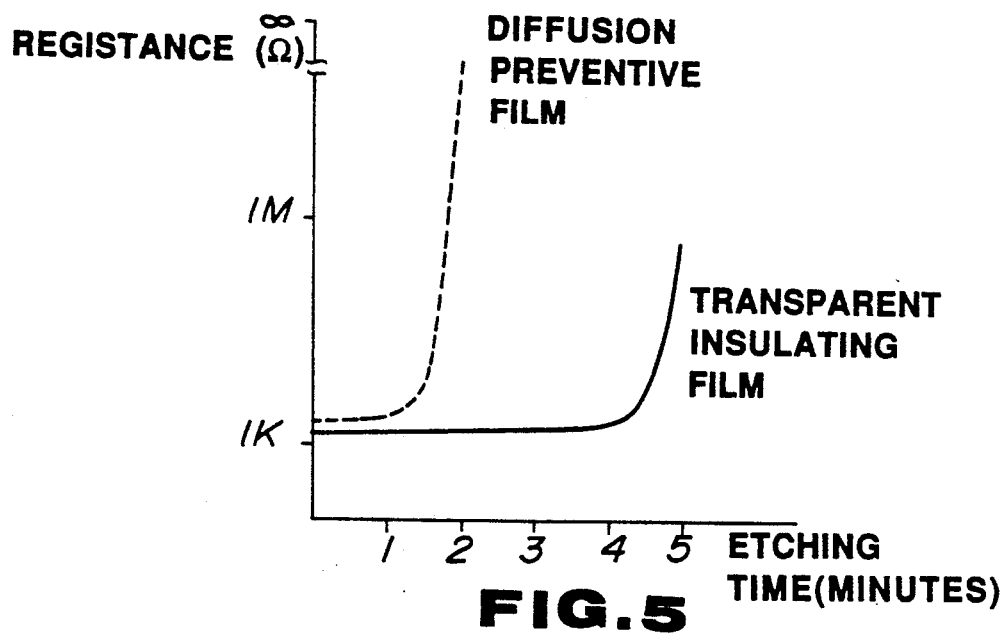
FIG. 5 is a graph showing changes in resistance values of a transparent insulating film surface and a diffusion preventive film surface.

After this process, ITO film 42 is removed with etching liquid including components $HCl:HNO_3:H_2O = 1:0.08:1$ at the temperature 35° C. Thereby pixel electrodes 41 are obtained. As a result, thin film transistor panel shown in FIG. 3 is completed. In this etching process whole ITO film is removed by etching. However, since metal-diffused layers 38a remain without being etched, conductivity of pixel electrodes 41 and the inner surfaces of contact holes 39 (parts of metal-diffused layers 38a) are kept. More specifically, FIG. 5 shows the relationship between etching time and change in resistance values on the areas of transparent insulating film 38 and diffusion preventive film 40 upon whole surface etching. The surface areas of transparent insulating film 38 recover their insulation property by etching for about two minutes. At the time, the surface areas of transparent insulating film 38 have a conductivity of several KΩ.

In this embodiment, diffusion preventive films 40 on transparent insulating film 38 are left as they are. However, diffusion preventive films 40 may be removed after the completion of the TFT panel. When diffusion preventive films 40 are left, they may be used as light shielding films for channel portions of thin film transistors T3 if diffusion preventive films 40 are made of opaque films. In addition, diffusion preventive films 40 which limit the metal diffusion areas on transparent insulating films 40 are made of SiN films in this embodiment. However, diffusion preventive films 40 are not restricted to SiN films if a metal is difficult to be diffused in the films.

However, in the thin film transistor panel described above, metal-diffused layers 38a deposited on the surface of transparent insulating film 38 are used as transparent pixel electrodes 41 by diffusing a conductive metal (ITO) in the surface areas of transparent insulating film 38 and the inner surfaces of contact holes 39. Also transparent pixel electrodes 41 are connected to source electrodes 36 of thin film transistors T3 by means of metal-diffused layers 38a on the inner surfaces of contact holes 39. As a result, transparent pixel electrodes 41 on transparent insulating film 38 can be connected to source electrodes 36 of thin film transistors T3 without filling a contacting metal in contact holes 39. Further, according to the thin film transistor panel described above, transparent pixel electrodes 41 and layers connecting transparent pixel electrodes 41 to source electrodes 36 can be formed at the same time in the surface areas of transparent insulating film 38 and the inner surfaces of contact holes 39 by diffusing conductive metal in the surface areas of transparent insulating film 38 and the inner surfaces of contact holes 39. As result, formation of transparent pixel electrodes 41 and connections between pixel electrodes 41 and source electrodes 36 of thin film transistors T3 can be accomplished at the same time. According, the thin film transistor panel of the present invention can be easily obtained.

Figure 6:
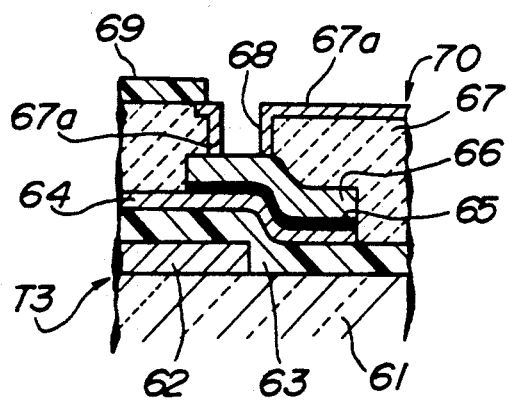
FIG. 6 is a schematic sectional view showing the contact hole in the embodiment in FIG. 3 as a through hole.

In the embodiment, the bottomed holes are provided in transparent insulating film 38 as contact holes 39, and metal-diffused layers 38a on the bottoms of contact holes 39 are connected conductively to source electrodes 36 of thin film transistors T3. However, it is possible to form contact hole 39 as a through hole which reaches the surface of source electrode 66, as shown in FIG. 6. In FIG. 6 since the lower surface of metal-diffused layer 67 which is diffused throughout the inner surface of contact hole 68 is contacted conductively to source electrode 66, transparent pixel electrode 70 made of metal-diffused layer 67 on transparent insulating film 69 can also be connected to source electrode 66 of thin film transistor T3. Furthermore, although transparent insulating films 38 is made of SOG in said embodiment, it is not limited to SOG if a metal can be diffused into the film. Also conductive metal which is diffused into transparent insulating film 38 is not limited to ITO if metal-diffused layers 38a can be used as transparent conductive films.

Figure 7:
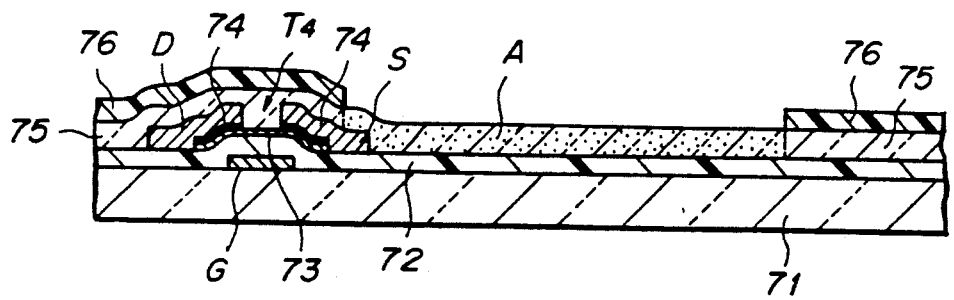
FIG. 7 is a schematic sectional view showing a pertinent portion of a thin film transistor panel according to another embodiment of the present invention.

Another embodiment of the present invention will be described below. Referring to FIG. 7, reference numeral 71 denotes a transparent substrate which is made of a glass plate, and the like. A lot of thin film transistors T4 are aligned on substrate 71 in row and column directions. Each of thin film transistor T4 is composed of gate electrode G formed on substrate 71, transparent gate insulating film 72 made of SiN and the like, i-a-Si semiconductor film 73 formed opposite to gate electrode G on gate insulating film 72, source and drain electrodes S and D formed over semiconductor film 73 through n+-a-Si contact layer 74. Gate insulating film 72 is formed on gate electrode G and substantially all over the substrate 71. Gate electrodes G are connected to the unshown gate lines which are formed on substrate 71, and drain electrodes D are connected to the unshown data lines which are formed on gate insulating film 72. In FIG. 7, reference symbol A denotes a transparent pixel electrode which is formed on gate insulating film 72 correspondingly to thin film transistor T4. On end portion of pixel electrode A is connected to source electrode S of thin film transistor T4. Transparent pixel electrode A is formed by forming SOG (Spin On Glass) film 75 on substrate 71 on which thin film transistor T4 has been formed, and diffusing a conductive metal in a predetermined area of SOG film 75 (pixel electrode area). SOG film 75 covers the whole upper surface of thin film transistor T4 and gate insulating film 72. The upper surface except for the area of pixel electrode A on SOG film 75 is covered by transparent upper insulating film 76 of SiN.

Figure 8A:
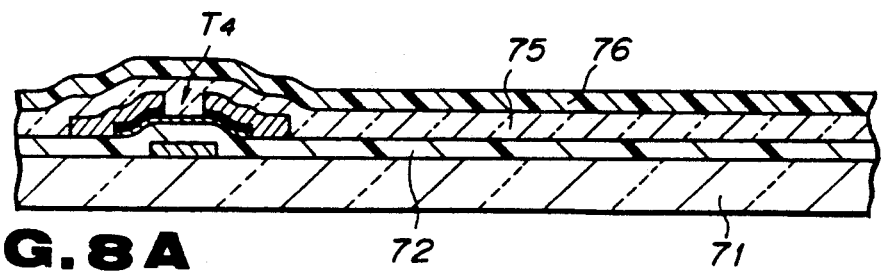
FIGS. 8A to 8D are schematic sectional views illustrating manufacturing steps of the thin film transistor panel according to the embodiment shown in FIG. 7.
Figure 8B:
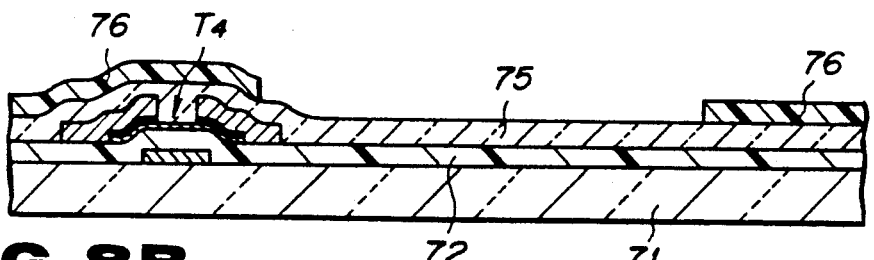
Figure 8C:
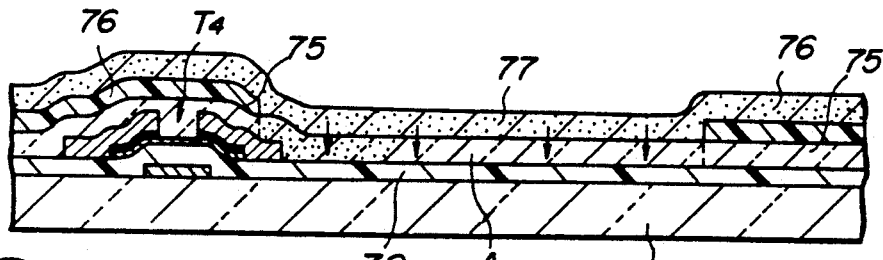
Figure 8D:
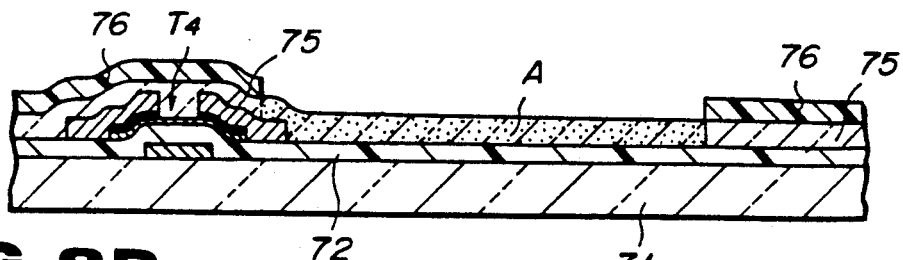

A manufacturing method of the thin film transistor panel will be described below. First, thin film transistor T4 is formed on transparent substrate 71 and then SOG film ($SiO_2$ film) 75 is formed thereon by applying silanol resin by means of spin coat process etc. and burning it, as shown in FIG. 8A. Upper insulating film 76 made of SiN is formed by means of plasma CVD process thereon. Then, upper insulating film 76 is patterned by means of dry etching using CF4 gas to thus remove upper insulating films 76 corresponding to pixel electrodes A, as shown in FIG. 8B. Conductive metal 77 such as In, Cr is deposited by means of sputtering or evaporation process on upper insulating films 76 and exposed portions of SOG film 75 as shown in FIG. 8C. Conductive metal 77 on SOG film 75 is then diffused into SOG film 75 by heating it at almost 300° C. for one or two hours. When conductive metal 77 is diffused into SOG film 75, the metal-diffused portions of SOG film 75 become conductive so that such metal-diffused portions of SOG film 75 can be used as transparent pixel electrodes A. Since diffused areas of conductive metal 77 on SOG film 75 are restricted by upper insulating films 76, conductive metal 77 can be diffused only in the areas which form pixel electrodes A of SOG film 75. As a result, pixel electrodes A can be formed in high pattern accuracy. After this, as shown in FIG. 8D, conductive metal 77 and metal-diffused portions of SOG film 75, i.e., pixel electrodes A are exposed to thus complete transparent electrode substrate.

However, since transparent pixel electrodes A are composed of metal-diffused portions of SOG film 75 by diffusing conductive metal 77 in predetermined areas of SOG film 75, a short-circuit between the electrodes due to the insufficient etching and damages to the substrate surface when forming the transparent electrode by etching the ITO film, can be prevented. In addition, since SOG film 75 can be formed by means of spin coat process etc. SOG film 75 can be deposited with sufficient thickness on the stepped portions between gate insulating films 72 and source electrodes S of thin film transistors T4. As a result, even if there are stepped portions, on the surface of gate insulating film 72, corresponding to transparent pixel electrodes A, transparent electrodes A on the stepped portions may not be cut because the conductive layers are formed by diffusing a metal in a predetermined areas of SOG film 75.

In addition, upper insulating films 76 are left on SOG film 75 as it is so as to limit metal-diffused areas on SOG film 75 in said embodiment. However, upper insulating films 76 may be removed together with conductive metal 77 after metal 77 is diffused in SOG film 75 and also, when leaving upper insulating films 76, they can be used as light shielding films by making upper insulating films 76 by opaque insulating films. Further, an active matrix type liquid crystal display device was described in said embodiment. However, the present invention can be applicable to simple matrix type liquid crystal display device or transparent electrode substrate for transparent touch input panel.

According to the embodiments described above, pixel electrodes are formed by diffusing a metal into the insulating film which is formed on the thin film transistors. However, the present invention is not limited to the embodiments. The pixel electrodes may be formed on the surface identical to the surface on which thin film transistors are formed or under the surface on which thin film transistors are formed.

Figure 9:
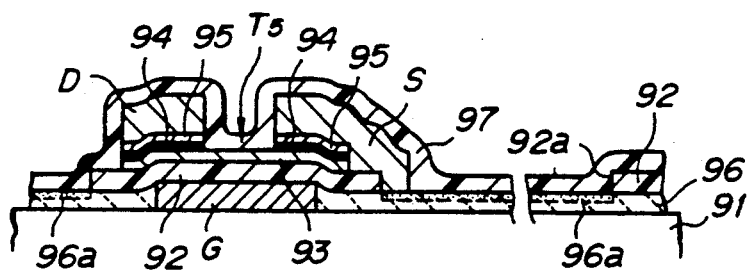
FIG. 9 is a schematic sectional view showing a pertinent portion of a thin film transistor panel according to still another embodiment of the present invention.

That is, FIG. 9 shows still another embodiment according to the present invention, wherein the pixel electrodes are formed on the surface identical to the surface on which thin film transistors are formed.

Referring to FIG. 9, reference numeral 91 denotes a transparent substrate made of glass plate etc. A lot of inverted stagger type thin film transistors T5 are aligned on substrate 91 in row and column directions. Each thin film transistor T5 is composed of gate electrode G formed on substrate 91, gate insulating film 92 made of SiN etc. and formed on gate electrode G, i-a-Si semiconductor film 93 formed on gate insulating film 92 opposite to gate electrode G, $n^+$-a-Si layer 94 which forms source and drain areas and formed on semiconductor layer 93, source and drain electrodes S and D which are formed over $n^+$-a-Si layer 94 through contact metal layer 95. Gate electrode G is connected to the unshown gate line formed on substrate 91, and drain electrode D is connected to the unshown data line formed on gate insulating film 92.

In FIG. 9, reference numeral 96 denotes a SOG film which is formed on transparent substrate 91. SOG film 96 is formed substantially all over substrate 91 except for the areas of gate electrode G and gate line of thin film transistor T5. Gate insulating film 92 of thin film transistor T5 is formed substantially all over substrate 91 on SOG film 96. Opening 92a for exposing the surface of SOG film 96 is provided in gate insulating film 92 so as to coincide with the pattern of transparent pixel electrode 96a corresponding to thin film transistor T5. Conductive metal such as Sn, In, ITO is diffused into the exposed area in opening 92a of gate insulating film 92 at a depth of almost 100 Å from the surface of SOG film. Metal-diffused area of SOG film 96 is used as transparent pixel electrode 96a which has a conductivity by metal diffusion. The outer end of source electrode S is overlapped on the edge portion of transparent pixel electrode 96a and is thus connected to pixel electrode 96a. In FIG. 9, reference numeral 97 denotes a transparent protective insulating film which is made of SiN etc. and covers thin film transistor T5 and pixel electrode 96a.

Figure 10A:
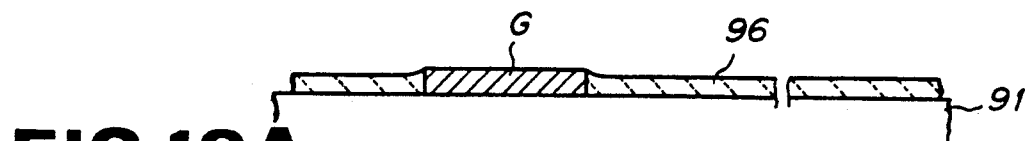
FIGS. 10A to 10F are schematic sectional views illustrating manufacturing steps of the thin film transistor panel according to the embodiment shown in FIG. 9.
Figure 10B:
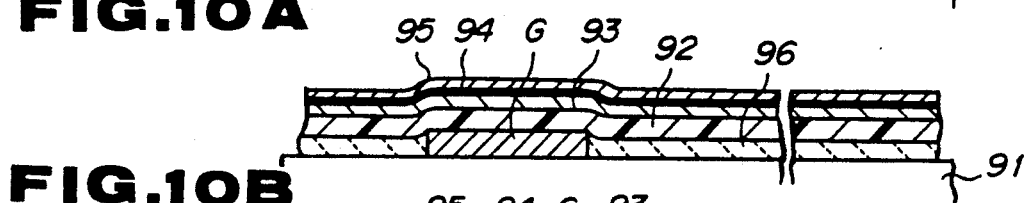
Figure 10C:
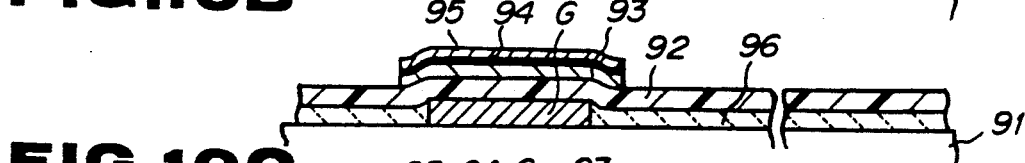
Figure 10D:
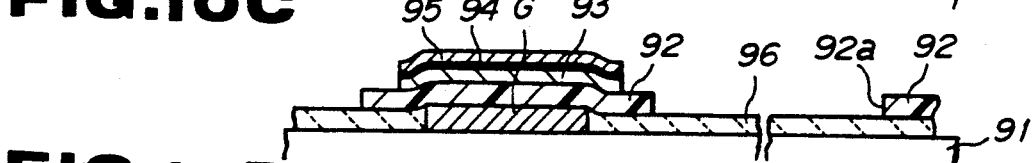

A manufacturing method of the thin film transistor of FIG. 9 will be describe below. First, gate electrodes G which are lower electrodes of inverted stagger type thin film transistors T5, and gate lines are formed by depositing metal film such as Cr, Ti on transparent substrate 91 and then pattering it. Then, SOG film (SiO$_2$ film) 96 is formed on substrate 91 by applying silanol resin by means of spin coat etc. all over substrate 91 and burning it. SOG film 96 is made flat to substantially identical level to gate electrodes G, as shown in FIG. 10A, by etching SOG film 96 back so as to expose the surface of gate electrodes G. As shown in FIG. 10B, gate insulating film (SiN film) 92, i-a-Si semiconductor layer 93, $n^+$-a-Si layer 94, and contact metal layer 95 made of Cr, Ti etc. are deposited in serial by means of plasma CVD process, sputtering process and the like. Then, contact metal layer 95, $n^+$-a-Si layer 94 and i-a-Si semiconductor layer 93 are patterned to the shapes of the transistor devices, as shown in FIG. 10C. Openings 92a for exposing pixel electrode forming areas on SOG film 96 are formed in gate insulating film 92, as shown in FIG. 10D, by etching predetermined areas (pixel electrode forming areas) of gate insulating film 92 correspondingly to patterns of pixel electrodes 96a by means of dry etching using CF4 gas. Openings 92a can be formed in high pattern accuracy due to easiness of etching of gate insulating film (SiN film) 92.

Figure 10E:
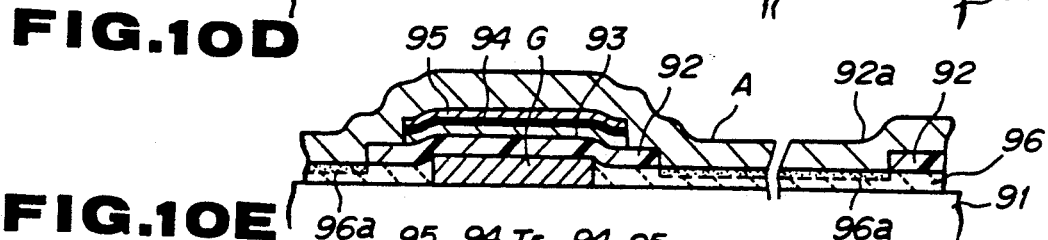
Figure 10F:
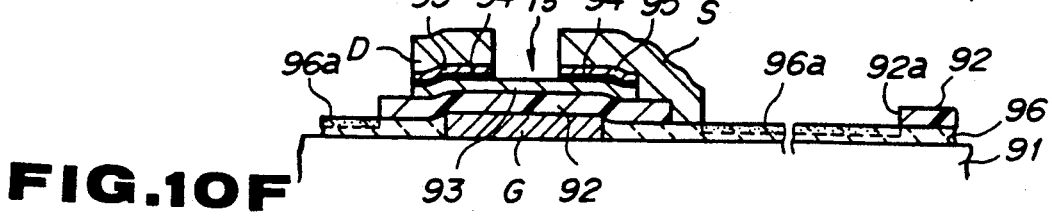

As shown in FIG. 10E, conductive metal A is deposited by means of sputtering or evaporation process. The metal A is made of Sn, In, ITO etc. and used as source and drain electrodes S and D. After this, conductive metal A is diffused into surface areas of SOG film 96 which are exposed in openings 92a by means of heat treatment. Metal A is heated for two or three hours at the temperature of almost 300° C. Where, "diffusion" means that metal molecules get into molecular clearances of SOG film 96. Conductive metal A is diffused into SOG film 96 from the surface at a depth of almost 100 Å by means of the heat treatment. In FIG. 10E, reference numeral 96a denotes metal-diffused areas of SOG film 96, and the areas 96a can be used as the transparent pixel electrodes as they are. Since transparent pixel electrodes (metal-diffused areas of SOG film 96) 96a are formed by limiting diffusible areas of conductive metal A into SOG film 96 by means of gate insulating film 92, the patterns of the pixel electrodes correspond to the shapes of openings 92a on gate insulating film 92. Therefore pixel electrodes 96a can be formed in high pattern accuracy. Then, as shown in FIG. 10F, source electrodes S, drain electrodes D and data lines are formed by patterning the film of conductive metal A. The outer portions of source electrodes S are overlapped on the side edge portions of pixel electrodes 96a. At that time, undesired portions of contact metal layers 95 and n-a-Si layers 94 between source and drain electrodes S and D are removed by etching. As a result, thin film transistor T5 have been completed and then film transistor panel shown in FIG. 9 has been completed by forming protective insulating film 97.

More specifically, according to the thin film transistor panel described above, the metal-diffused areas of SOG film 96 can be used as transparent pixel electrodes 96a by diffusing conductive metal A into predetermined areas of SOG film 96 so as to give the areas conductivity. Pixel electrodes 96a can be obtain in high pattern accuracy by masking areas of SOG film 96 except for the areas corresponding to the pixel electrodes by gate insulating films 9 and then diffusing conductive metal A thereon. As a result, dimensional accuracy as to transparent pixel electrodes 96a can be obtained highly. Accordingly, high density display can be achieved by making pixel electrodes 96a minutely. In addition, in this embodiment, since gate insulating film 92 is used as a mask for limiting metal diffused areas of SOG film 96 ad since metal A which forms source and drain electrodes S and D are diffused into SOG film 96, thin film transistor panel can be made efficiently by few steps and at low cost.

In said embodiment, metal A corresponding to source and drain electrode S and D is used as a conductive metal which is diffused in SOG film 96. However, such conductive metal may be formed by other metals. In this case, after conductive metal is deposited on SOG film 96 and is diffused into SOG film 96 by heat treatment, source and drain electrodes S and D may be formed and then the deposited metal is removed by etching process. Gate insulating film 92 is used as a mask for limiting metal diffused areas on SOG film 96 is said embodiment. However, the mask may be formed by photoresist process etc. In this case, conductive metal can be diffused into SOG film 96 at any time in the course of manufacturing steps of the thin film transistor panel.

Furthermore, the thin film transistors are made of inverted stagger type transistors. However, the thin film transistors ma be composed of inverted coplanar type or stagger type transistors. When stagger type transistors are applied as the thin film transistors, a metal corresponding to source and drain electrodes or other conductive metal may be diffused into SOG film to make transparent pixel electrodes in a similar manner to said embodiment. When a inverted coplanar type transistor is applied, a metal corresponding to gate electrodes or other conductive metal may be diffused into SOG film to make transparent pixel electrodes. When stagger transistors are applied as the thin film transistors, since the lower electrodes, i.e., source and drain electrodes are formed on the transparent substrate, transparent pixel electrodes and the source electrodes of thin film transistors can not be formed overlappingly. The transparent pixel electrodes are formed by diffusing the conductive metal into the SOG film which is formed on the substrate except for the source and drain electrode areas. However, when parts of conductive metal formed on the SOG film are left with extending over pixel and source electrodes so as to diffuse a metal into SOG film, the conductive metal can connect pixel electrodes and source electrodes conductively and firmly.

Figure 11:
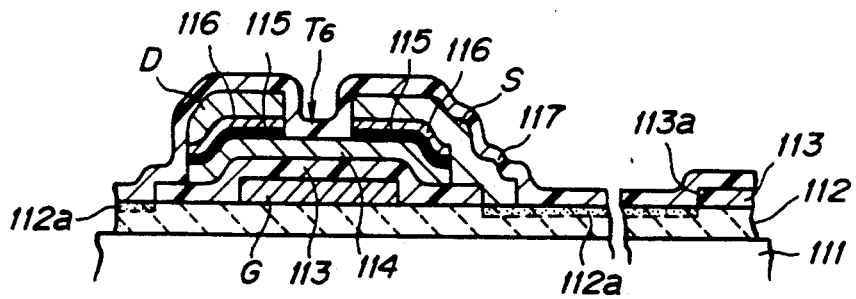
FIG. 11 is a schematic sectional view showing a pertinent of a thin film transistor panel according to still another embodiment of the present invention.

FIG. 11 shows still another embodiment of the present invention wherein the pixel electrodes are formed under the surface on which thin film transistors are formed. In FIG. 11, reference numeral 111 denotes a transparent substrate made of glass plate etc. SOG film 112 is formed on substrate 111 substantially all over the surface 111. A lot of inverted stagger type thin film transistors T6 are aligned on SOG film 112 in row and column directions. Each of thin film transistor T6 is composed of gate electrode G formed on SOG film 112, gate insulating film 113 made of SiN etc. and formed on gate electrode G, i-a-Si semiconductor film 114 formed on gate insulating film 113 opposite to gate electrode G, n+-a-Si layer 115 which forms source and drain areas and is formed on semiconductor layer 114, and source and drain electrodes S and D which are formed over n+-a-Si layers 115 through contact metal layers 116. Gate electrode G is connected to the unshown gate line formed on SOG film 112, and drain electrode D is connected to the unshown data line formed on gate insulating film 113.

Gate insulating film 113 is formed substantially all over SOG film 116. Openings 113a for exposing the surfaces of SOG film 112 ar provided in gate insulating film 113 so as to coincide with the patterns of transparent pixel electrodes 112a corresponding to thin film transistor T6. Conductive metal such as Sn, In, ITO is diffused into the exposed areas in openings 113a of gate insulating film 113 at a depth of almost 100 Å from the surface of SOG film. Metal-diffused areas of SOG film 112 is used as transparent pixel electrodes 112a which have conductivity by metal diffusion. The outer end of source electrode S of thin film transistor T6 is overlapped on the edge portion of transparent pixel electrode 112a and is thus connected to the pixel electrode 112a. In FIG. 11, reference numeral 117 denotes a transparent protective insulating film which is made of SiN etc. and covers thin film transistors T6 and pixel electrode 112a.

Figure 12A:
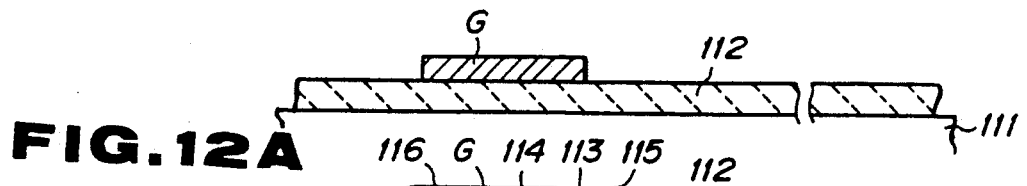
FIGS. 12A to 12F are schematic sectional views illustrating manufacturing steps of the thin film transistor panel according to the embodiment shown in FIG. 11.
Figure 12B:
Figure 12C:
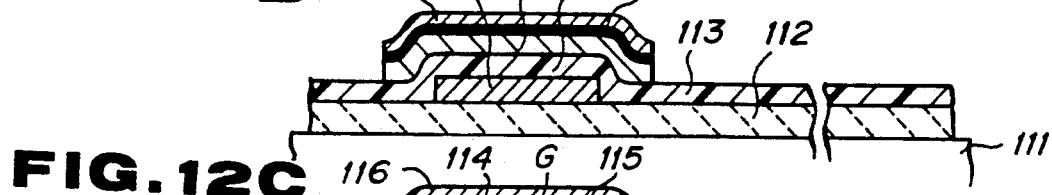
Figure 12D:
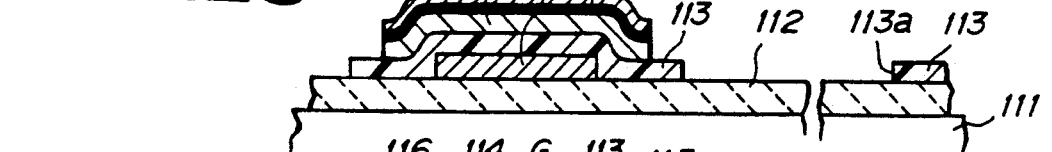

A manufacturing method of the thin film transistor panel will be described below. First, SOG film (SiO$_2$ film) 112 is formed on substrate 111 by applying silanol resin by means of spin coat process etc. all over transparent substrate 111 and burning it, as shown in FIG. 12A. Then, a gate electrode G and gate lines are formed by means of depositing a metal film such as Cr, Ti on SOG film 112 and patterning it. As shown in FIG. 12B, gate insulating film (SiN film ) 113, i-a-Si semiconductor layer 114, n+-a-Si layer 115, and contact metal layer 116 made of Cr, Ti etc. are deposited serially by means of plasma CVD process, sputtering process and the like. Then, contact metal layer 116, n+-a-Si layer 115 and i-a-Si semiconductor layer 114 are patterned to the shape of the transistor devices, as shown in FIG. 12C. Openings 113a for exposing pixel electrodes forming areas on SOG film 112 are formed in gate insulating film 113, as shown in FIG. 12D, by etching predetermined areas (pixel electrode forming areas) of gate insulating film 113 correspondingly to patterns of pixel electrodes 112a by means of dry etching using $CF_4$ gas. Openings 113a can be formed in high pattern accuracy due to easiness of etching of gate insulating film (SiN film) 113.

Figure 12E:
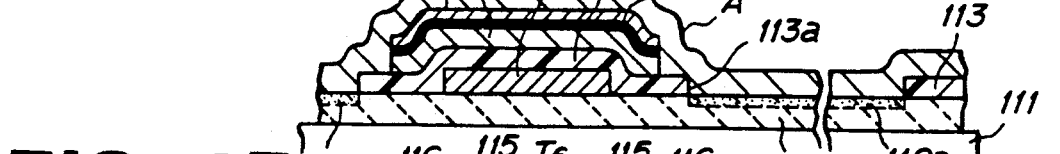
Figure 12F:
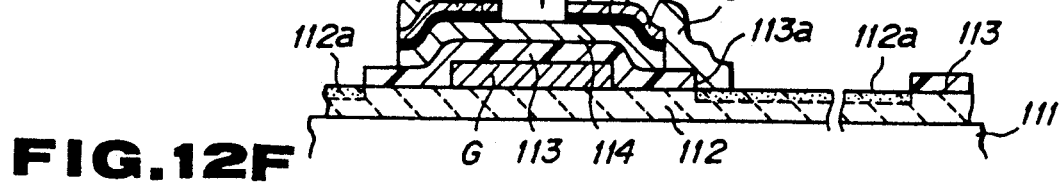

As shown in FIG. 12E, conductive metal A is deposits by means of sputtering or evaporation process. The metal A is made of Sn, In, ITO etc. and used as source and drain electrode S and D. After this, conductive metal A is diffused into areas of SOG film 112 which are exposed in openings 113a on gate insulating film 113, by means of heat treatment. Metal A is heated for two or three hours at the temperature of almost 300° C. Where, "diffusion" means that metal molecules get into molecular clearances of SOG film 112. Conductive metal A is diffused into SOG film 112 the surface at a depth of almost 100 Å by means of the heat treatment. In FIG. 12E, reference numeral 112a denotes metal-diffused areas of SOG film 112, and the areas 112a can be used as the transparent pixel electrode as they are. Since transparent pixel electrodes (metal-diffused areas of SOG film 112) 112a are formed by limiting diffusible areas of conductive metal A into SOG film 112 by means of gate insulating film 113, the patterns correspond to the shapes of openings 113a on gate insulating film 113. Therefore, pixel electrodes 112a can be formed in high patter accuracy. Then, as shown in FIG. 12F, source electrodes S, drain electrodes D and the data lines are formed by patterning the film of conductive metal A. The outer portion of source electrodes S are overlapped on the side edge portions of pixel electrodes 112a. At that time, undesired portions of contact metal layer 116 and n+-a-Si layer 115 between source and drain electrodes S and D are removed by etching. As a result, thin film transistor T6 has been completed and thin film transistor panel shown in FIG. 11 has been completed by forming protective insulating film 117.

More specifically, according to the thin film transistor panel described above, the metal-diffused areas of SOG film 112 can be used as transparent pixel electrodes 112a by diffusing conductive metal A into a predetermined areas of SOG film 112 so as to give the areas conductivity. Pixel electrodes 112a can be obtain in high pattern accuracy by masking areas of SOG film 112 except for the areas corresponding to the pixel electrodes by gate insulating film 113 and then diffusing conductive metal A thereto. As a result, as in the embodiment shown in FIG. 11, dimensional accuracy as to transparent pixel electrodes 112a can be obtained highly. Accordingly, high density display can be achieved by masking pixel electrodes 112a minutely. Since the thin film transistors are formed by forming SOG film 112 on transparent substrate 111 and forming thin film transistors T6 and gate lines thereon, even if transparent substrate 111 has damages thereon, the damages on the substrate are buried by SOG film 112. Therefore, the disconnections of gate and data lines due to the damages on substrate 111 can be prevented. In addition, in this embodiment since gate insulating film 113 is used as masks for limiting the metal-diffused areas of SOG film 96 and since metal A which forms source and drain electrodes S and D are diffused into SOG film 96, thin film transistor panel can be made efficiently by few steps and at low cost.

Furthermore, the thin film transistors are made of inverted stagger type transistors. However, the thin film transistors may be composed of inverted coplanar type, coplanar type, or stagger type transistors.

Figure 13:
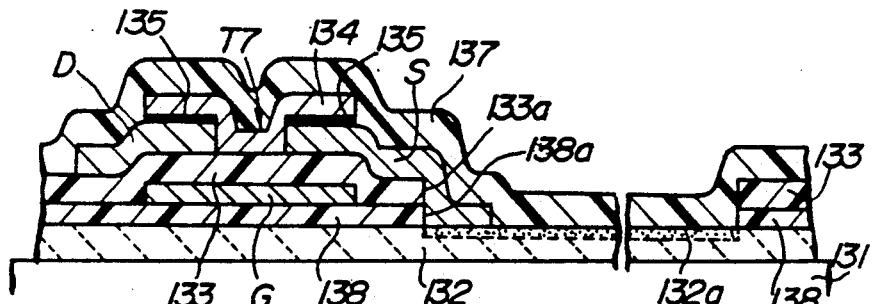
FIG. 13 is a schematic sectional view showing a pertinent portion of a thin film transistor panel according to still another embodiment of the present invention.

FIG. 13 shows another embodiments of the present invention. The thin film transistor panel of this embodiment is made of inverted coplanar type transistors. The thin film transistor panel is constructed by forming SOG film 132 on transparent substrate 131, forming ground insulating film 138 such as SiN which also acts as a mask for limiting the metal-diffused areas on SOG film 132 thereon, then forming inverted coplanar type thin film transistor T7 on ground insulating film 138. Transparent pixel electrodes 132a are formed by diffusing a conductive metal in the exposed areas in openings 138a which are formed on the ground insulating film 138a correspondingly to the patterns of the pixel electrodes. Incidentally, the description as to the construction of the inverted coplanar type thin film transistors is omitted since only the layer construction as to the electrodes and the semiconductor layers are different.

Figure 14A:
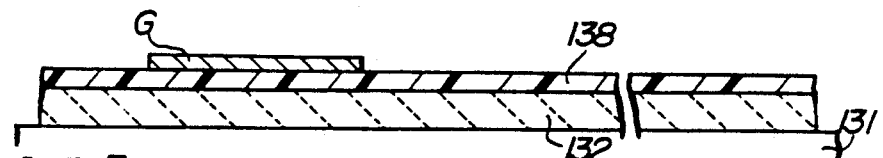
FIGS. 14A to 14E are schematic sectional views illustrating manufacturing steps of the thin film transistor panel according to the embodiment shown in FIG. 13.
Figure 14B:
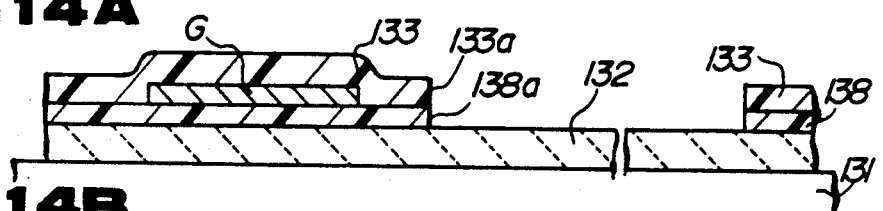
Figure 14C:
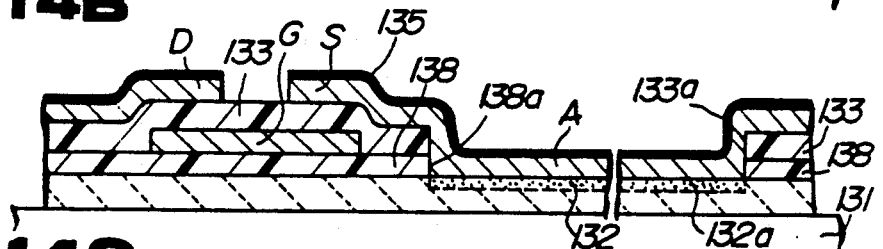
Figure 14D:
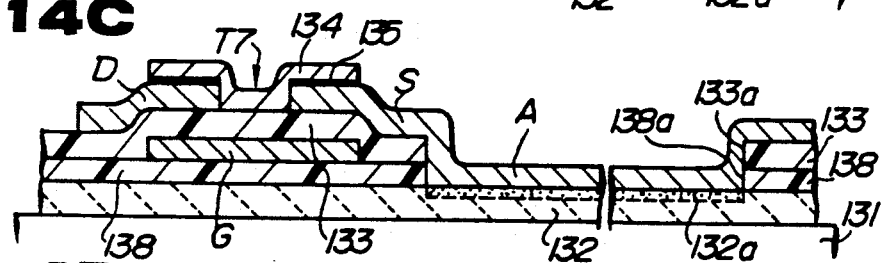
Figure 14E:
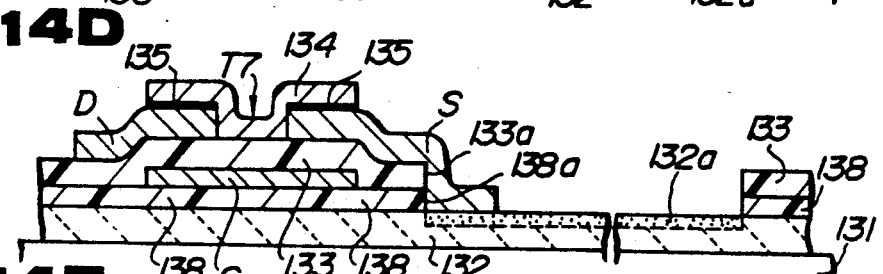

The thin film transistor panel is manufactured by the following steps. First, as shown in FIG. 14A, SOG film 132 is formed on transparent substrate 131 and then ground insulating film (SiN film) 138 is formed thereon. After this, gate electrodes G and gate liens (not shown) are formed. Then, as shown in FIG. 14B, gate insulating film (SiN film) 133 is formed, and openings for exposing the pixel electrode areas of SOG film 132 are formed in gate insulating film 133 and in ground insulating film 138. Conductive metal A and n+-a-Si layer corresponding to source and drain electrodes S and D are deposited as shown in FIG. 14C and then heat treatment is performed so as to diffuse conductive metal A into the pixel electrode areas of SOG film 132. As a result, transparent pixel electrodes 132a are obtained. Then, as also shown in FIG. 14C, n+-a-si layer 135 and the film of conductive metal A are patterned so as to from source and drain electrodes S and D and data lines (not shown). At that time, conductive metal A and n+-a-Si layer 135 which are deposited on pixel electrodes 132a are left without being removed. The reason why conductive metal A on pixel electrodes 132a are left is that pixel electrodes 132a may be prevented from being deleted by etching at the time of patterning i-a-Si semiconductor layer 134. As shown in FIG. 14D, i-a-Si semiconductor layer 134 is deposited. Layer 134 and n+-a-Si layer 135 are patterned by wet or dry etching, and then conductive metal A on pixel electrodes 132a are removed by etching as shown in FIG. 14E with leaving the areas of source electrodes S which are overlapped on the edge portions of pixel electrodes 132a. As a result, the thin film transistors T7 are constructed and the thin film transistor panel in FIG. 13 is completed by forming protective insulating film 137.

In this embodiment, the metal-diffused areas of SOG film 132 can be used as transparent pixel electrodes 132a by diffusing conductive metal A into predetermined areas of SOG film 132 formed on transparent substrate 131. Pixel electrodes 132a can be obtained in high pattern accuracy. In this embodiment, SOG film 132 and ground insulating film 138 are formed as two layers on transparent substrate 131, and thin film transistors T7 and gate and data lines are formed thereon. As a result, even if transparent substrate 131 has considerably deep damages on the surface, the surface of thin film transistors T7 (surface of ground insulating film 138) becomes flat. Therefore, the disconnections of gate and data lines due to the damages on substrate 131 can be prevented.

Figure 15:
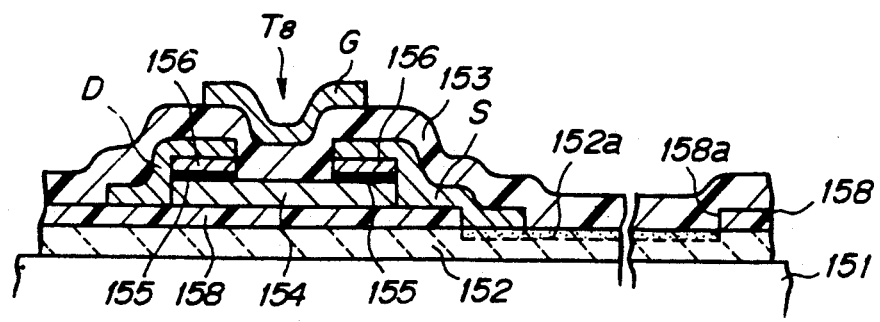
FIG. 15 is a schematic sectional view showing a pertinent portion of a thin film transistor panel according to still another embodiment of the present invention.

FIG. 15 shows another embodiments of the present invention. In this embodiment the thin film transistor panel comprises coplanar type transistors. The thin film transistor panel is constructed, as shown in FIG. 15, by forming SOG film 152 on transparent substrate 151, forming ground insulating film 158 such as SiN which also acts as a mask for limiting the metal-diffused areas on SOG film 152 thereon, then forming coplanar type thin film transistors T8 on ground insulating film 158. Transparent pixel electrodes 152a are formed by diffusing a conductive metal in exposed areas in openings 158a which are formed in the ground insulating film 158 correspondingly to the patterns of the pixel electrodes. Incidentally, the descriptions as to the construction of the coplanar type thin film transistors T8 is omitted since the layer construction as to the electrodes and semiconductor layers are formed only reversely.

Figure 16A:
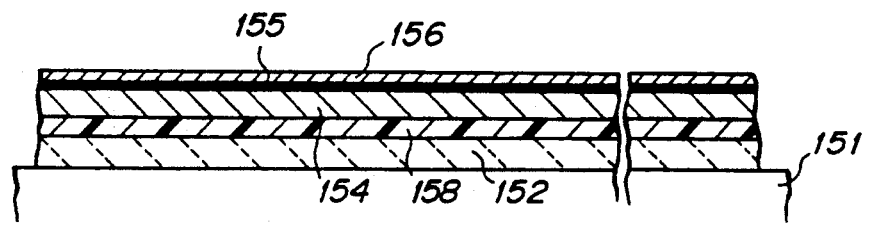
FIGS. 16A to 16D are schematic sectional views illustrating manufacturing steps of the film transistor panel according to the embodiment shown in FIG. 15.
Figure 16B:
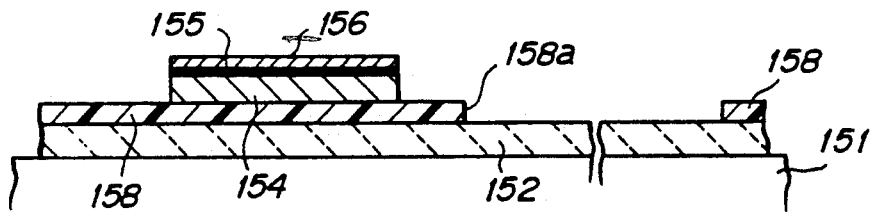
Figure 16C:
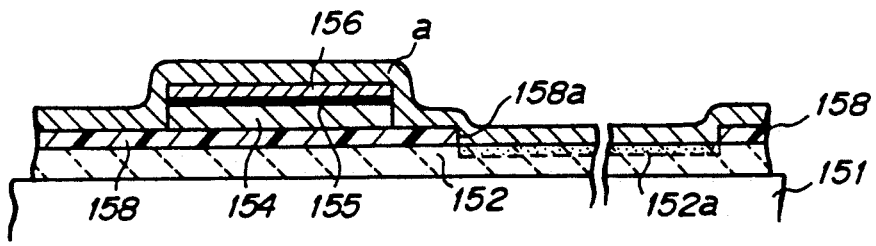
Figure 16D:
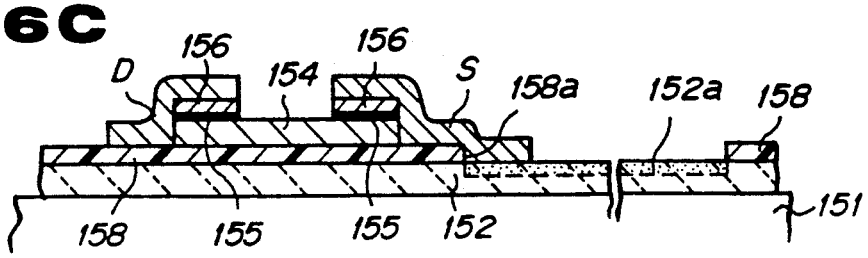

The thin film transistor panel is manufactured by the following steps. First, as shown in FIG. 16A, SOG film 152 is formed on transparent substrate 151 and then ground insulating film (SiN film) 158, i-a-Si semiconductor layer 154, n+-a-Si layer 155 and contact metal layer 156 are formed thereon serially. After this, as shown in FIG. 16B, contact metal layer 156, n+-a-Si layer 155 and i-a-Si semiconductor layer 154 are patterns to the shapes of transistor devices. Then, openings 158a for exposing pixel electrode areas of SOG film 152 are formed in ground insulating film 158. Conductive metal A corresponding to source and drain electrodes S and D are deposited as shown in FIG. 16C. Then heat treatment is performed so as to diffuse conductive metal A into the pixel electrode areas of SOG film 152. As a result, transparent pixel electrodes 152a are obtained. Then, as shown in FIG. 16D, the film of conductive metal A is patterned so as to form source and drain electrodes S and D and data lines. The outer portions of source electrode S are overlapped on the side peripheral portions of pixel electrodes 152a. At the same time, undesired portions of contact metal layer 156 and n+-a-Si layer 155 are removed by etching. Gate insulating film (SiN film) 153 which acts also as protective insulating film is formed. Gate electrodes G and the gate lines are formed on gate insulating film 153 to thus complete thin film transistors T8. Accordingly, thin film transistor panel in FIG. 15 is completed.

Figure 17:
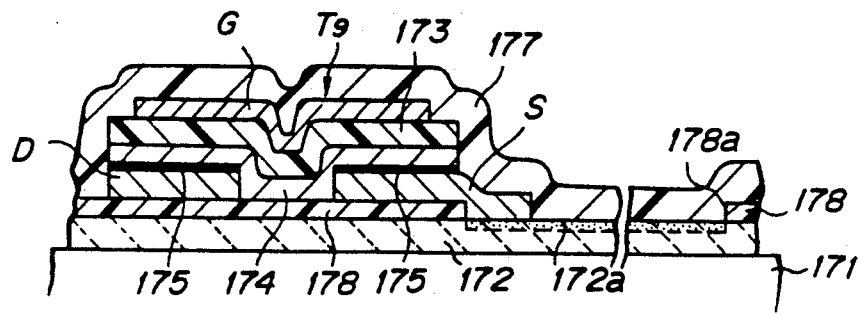
FIG. 17 is a schematic sectional view showing a pertinent portion of a thin film transistor panel according to still another embodiment of the present invention.

FIG. 17 shows another embodiments of the present invention. In this embodiment, the thin film transistor panel comprises the stagger type transistors. The thin film transistor panel is constructed, as shown in FIG. 17, by forming SOG film 172 on transparent substrate 171, forming ground insulating film 178 such as SiN which also acts as a mask for limiting the metal-diffused areas on SOG film 172 thereon, then forming coplanar type thin film transistors T9 on ground insulating film 178. Transparent pixel electrodes 172a are formed by diffusing a conductive metal in the exposed areas in openings 178a which are formed on the ground insulating film 178 correspondingly to the patterns of the pixel electrodes. The description as to the construction of the stagger type thin film transistors T9 is omitted since the layer construction as to the electrodes and semiconductor layer are formed only reversely in comparison with the inverted stagger type transistors.

Figure 18A:
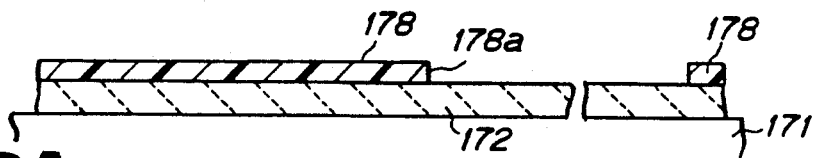
FIGS. 18A to 18E are schematic sectional views illustrating manufacturing steps of the thin film transistor panel according to the embodiment shown in FIG. 17.
Figure 18B:
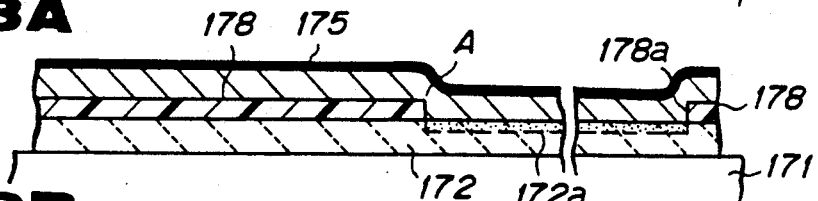
Figure 18C:
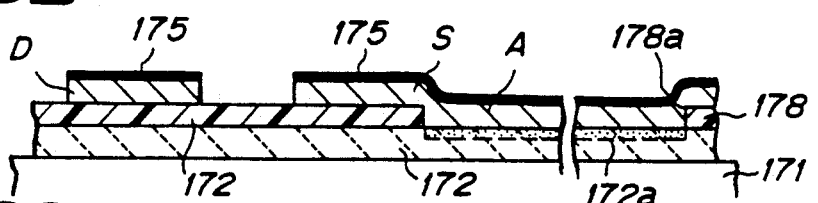
Figure 18D:
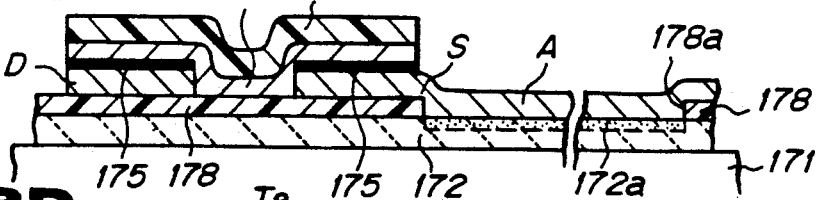
Figure 18E:
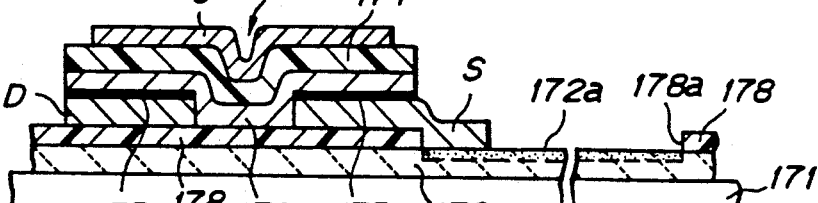

The thin film transistor panel is manufactured by the following steps. First, as shown in FIG. 18A, SOG film 172 is formed on transparent substrate 171 and then ground insulating film (SiN film) 178 is formed thereon. After this, openings 178a for exposing the pixel electrode areas of SOG film 172 are formed on ground insulating film 178. As shown in FIG. 18B, conductive metal A and n+-a-Si layer 175 corresponding to source and drain electrodes S and D are deposited. Then heat treatment is performed so as to diffuse conductive metal A into the pixel electrode areas of SOG film 172. As a result, transparent pixel electrodes 172a are obtained. Then, as shown in FIG. 18C, the film of conductive metal A and n+-a-Si layer 175 are patterned so as to form source and drain electrodes S and D and data lines. At that time, conductive metal A and n+-a-Si layer 175 which are deposited on pixel electrodes 172a are left without being removed. Then, i-a-Si semiconductor layer 174 and gate insulating film (SiN film) 173 are deposited. Gate insulating film (SiN film) 173, i-a-Si semiconductor layer 174 and n+-a-Si layer 175 are patterned to the shapes of transistor devices, as shown in FIG. 18D. Conductive metal A on pixel electrodes 172a is removed by etching as shown in FIG. 18E with leaving the areas of source electrodes S which are overlapped on the edge portion of pixel electrodes 172a and, at that time, gate electrodes G and gate lines are formed on gate insulating film 173. As a result, the thin film transistors T9 are constructed and the thin film transistor panel in FIG. 17 is completed by forming protective insulating film 177.

In the embodiments in FIGS. 15 and 17, the metal-diffused areas of SOG film can be used as transparent pixel electrodes by diffusing conductive metal A into predetermined areas of SOG film. Pixel electrodes can be obtained in high pattern accuracy. In this embodiment, SOG film is formed on transparent substrate, and thin film transistors and gate and data lines are formed thereon. As a result, even if transparent substrate has damages on the surface, the disconnections of gates and data lines due to the damages on substrate can be surely prevented.

In said embodiments, metal A corresponding to source and drain electrodes S and D is used as a conductive metal which is diffused in SOG film. However, such conductive metal may be formed by other metals. In this case, after conductive metal is deposited on SOG film and is diffused into SOG film by heat treatment, source and drain electrodes S and D may be formed and then the deposited metal is removed by etching process. When coplanar type or stagger type transistors are used as thin film transistors, it is possible to use the same metal as the gate electrode G which is diffused into the SOG film. In this case, firstly openings for exposing the areas for the pixel electrodes on SOG film are formed in the gate insulating film, then conductive metal corresponding to gate electrode G and gate lines are deposited thereon. The conductive metal can be diffused by heat treatment thereafter. The gate insulating film and the ground insulating film are used as a mask for limiting metal diffused areas on SOG film in said embodiment. However, the mask may be formed by photoresist process etc. In this case, conductive metal can be diffused into SOG film at any time in the course of manufacturing steps of the thin film transistor panel.

Figure 19:
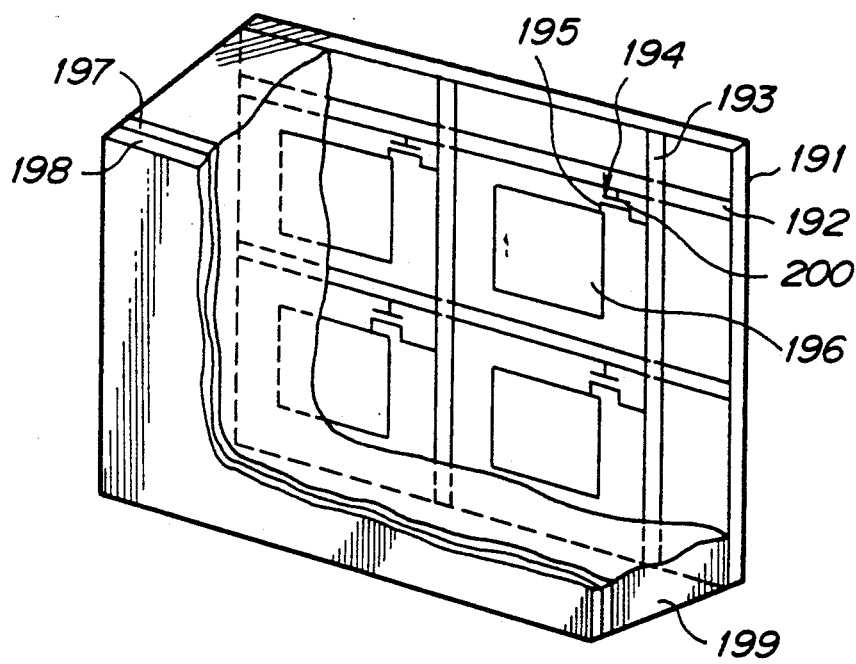
FIG. 19 is a perspective view showing a liquid crystal display device in which the thin film transistor panel of the present invention is used.

The thin film transistor panel of the present invention described above will be used as a liquid crystal display device in which the opposing substrate for interposing a liquid crystal therebetween as shown in FIG. 19. More specifically, gate lines 192 and drain lines 193 are aligned in a matrix form on transparent insulating substrate 191 and thin film transistors 194 are arranged at crossing portions. Since the thin film transistors have the same construction as the transistors described above, it is shown as an equivalent circuit. Pixel electrodes 196 are connected to source electrodes 195 of thin film transistors 194. Pixel electrodes 196 are not shown, but are formed by diffusing predetermined areas of diffusible insulating film which covers gate lines 192, drain lines and thin film transistors 194. Pixel electrodes 196 are arranged respectively a plurality of areas surrounded by gate lines 192 and drain lines 193 and are separated electrically each other. The outer shapes of pixel electrodes 196 are formed adjacent to gate lines 192 and drain lines 193. As described in the embodiments, pixel electrodes 196 and source electrodes 195 are connected directly or through contact holes. Transparent opposing substrate 198 on which transparent electrodes 197 are formed is arranged opposite to the thin film transistor panel, and a liquid crystal 199 is interposed into the substrates to thereby complete a liquid crystal display device.

The liquid crystal display device is operated as follows. The scanning signals are serially supplied to a plurality of gate lines 192 and the data signals for controlling the active state of the pixels are supplied to a plurality of drain lines 193 in coincidence with the timing of the scanning signals. When the scanning signal is supplied to the gate electrodes 200, the thin film transistors are turned ON, reads the data signals supplied at that timing and supplies it to the pixel electrode 196. In accordance with potential difference applied to the opposing electrodes, electric fields are applied to liquid crystal 199 between the pixel electrodes to which the data signals are supplied and transparent electrodes 197 on opposing substrate 198. Liquid crystal 199 changes its molecular orientation according to the electric field so as to control a transmission and interception of light.

As described above, according to the thin film transistor panel of the present invention, the pixel electrodes are formed by diffusing conductive material into predetermined areas of the diffusible insulating film so as to give the conductivity in the areas so that the pixel electrodes can be formed in high pattern accuracy to obtain the minute pixel electrodes. Accordingly, the liquid crystal display device using the thin film transistor panel of the present invention is able to realize an extremely high density image display.

As described in detail, the present invention can provide the thin film transistor panel which is able to achieve high density display by the minute electrodes and prevent the disconnections between gate and drain lines, as described above, and which can be very easily manufactured since diffusible insulating materials are used in the thin film transistor panel and the insulating materials are used as the pixel electrodes by diffusing them to give the conductivity.

The present inventions are not limited to the formation of pixel electrodes. The wiring constructions of the thin film transistor panel of the present invention are described below.

Figure 20:
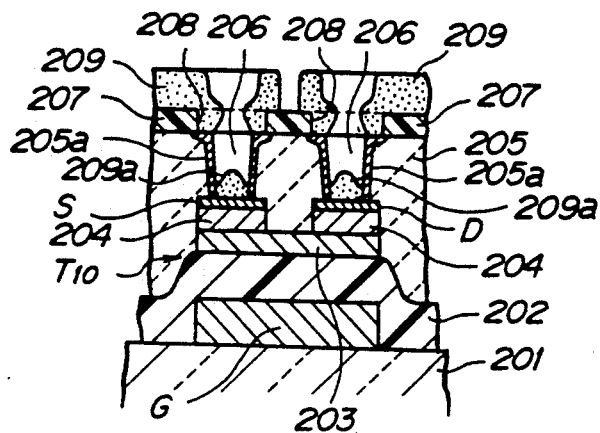
FIG. 20 is a schematic sectional view showing a pertinent portion of a thin film transistor panel according to still another embodiment of the present invention.

FIG. 20 is a perspective view showing an embodiment of a wiring connection of the thin film transistor panel of the present invention. This embodiment can be applied to the panel in which an inverted stagger type transistors are used as the transistor.

Figure 2:
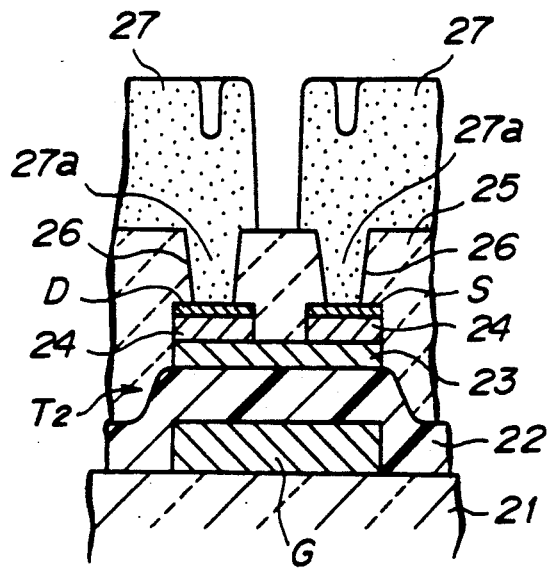

In FIG. 20, reference symbol 201 denotes an insulating substrate made of a glass plate etc.; and T10, an inverted stagger type thin film transistor which is formed on insulating substrate 201. Transistor T10 has the same construction as thin film transistor T2 shown in FIG. 2. Reference numeral 205 denotes a transparent insulating film which covers thin film transistors T10. Transparent insulating film 205 is made of a transparent insulating material such as SOG (Spin On Glass) into which a metal can be diffused and which is set to almost 1 μm in thickness. Contact holes 206 are provided in transparent insulating film 205 correspondingly to source and rain electrodes S and D of thin film transistor T10. The depth of contact hole 206 reaches source and drain electrodes S and D. Reference numeral 207 denotes a diffusion preventive film which is formed on insulating film 205. Openings 208 are provided in diffusion preventive film 207 correspondingly to the areas of contact holes of insulating film 205. The diameter of opening 208 is slightly larger than the upper diameter of contact holes 206. Diffusion preventive films 207 are provided so as to limit the diffusion areas at the time when metal-diffused layer 205a, described layer in detail, are formed by diffusing a metal in insulating film 205. Therefore, diffusion preventive films 207 are made of the insulating material, e.g., SiN into which a metal is difficult to be diffused. Metal-diffused layer 205a is formed on the areas of insulating film 205 without diffusion preventive film 207, i.e., contact hole forming areas corresponding to openings 208 in diffusion preventive film 207 and all over the inner surfaces of contact holes and the surfaces of insulating film 205 in the peripheral areas of the constant holes. Metal-diffused layer 205a is made by diffusing conductive metal made of ITO into insulating film 205. Reference numeral 209 denotes wirings which are formed on insulating film 205 and are made of conductive metal such as Al etc. Parts of wirings 209 are overlapped on metal-diffused layers 205a in the peripheral areas of contact holes 206 and are connected to metal-diffused layer 205a conductivity. Reference numeral 209a denotes a contact metal layer which are formed on the inner bottom area of contact holes 206. Contact metal layers 209a are made of the same metal as wirings 209 and is contacted to source and drain electrodes S and D and the metal-diffused layers 205a on the inner surfaces of contact holes 206 to thus connect conductively source and drain electrodes S and D and metal-diffused layers 205a on the inner surface of contact holes.

Figure 21A:
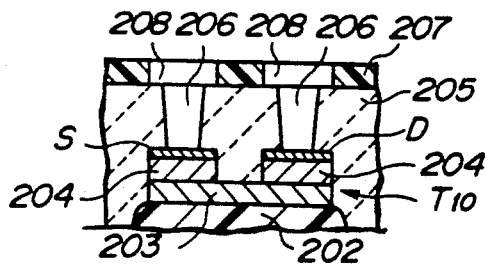
FIGS. 21A to 21C are schematic sectional views illustrating manufacturing steps of the thin film transistor panel according to the embodiment shown in FIG. 20.
Figure 21B:
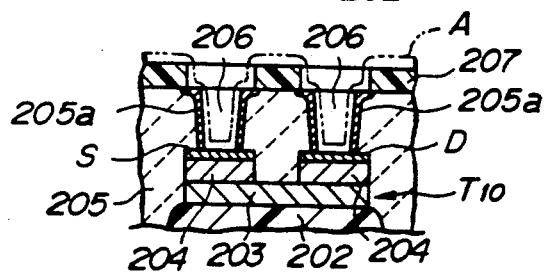

Process of forming metal-diffused layers 205a, wirings 209 and contact metal layers 209a will be described below with reference to FIGS. 21A to 21C. First, thin film transistors T10 are formed on insulating substrate 201 and then transparent insulating film (SOG film) 205 is formed by applying SOG on substrate 201 by almost 1 μm in thickness and during it, as shown in FIG. 21A. Contact holes 206 are formed by etching insulating film 205 correspondingly to source and drain electrodes S and D of thin film transistors T10. Then, SiN is deposited on insulating film 205 by means of plasma CVD process by almost 1000 Å in thickness so as to form diffusion preventive films 207, as shown in FIG. 21A. Openings 208 for exposing the contact holes are formed in insulating film 205 by etching. Then, ITO film A is deposited by sputtering ITO as a conductive metal which is diffused into insulating film 205 all over the surface of insulating film 205 and the inner surfaces of contact holes 206, as shown in by a chain line in FIG.

21B. The ITO sputtering is performed at the substrate temperature of almost 300° C. When ITO sputtering is performed, ITO film A is deposited all over the surface of insulating film 205 and the inner surfaces of contact holes 206 and, at the same time, deposited ITO is heat diffused into insulating film 205 in the areas uncovered by diffusion preventive films 207. As a result, metal-diffused layers 205a into which ITO is diffused are formed all over the surfaces in the peripheral areas of the contact holes and the whole inner surfaces of contact holes 206 in insulating film 205, as shown in FIG. 21B. ITO film A is also deposited on diffusion preventive film 207 and source and drain electrodes S and D exposed in contact holes 206. However, since diffusion preventive films 207 are made of SiN film into which metal is unable to diffuse, ITO diffusion scarcely occurs in diffusion preventive films 207 and ITO A deposited on source and drain electrodes S and D is only deposited on electrodes S and D.

The ITO sputtering is performed to the level that the ITO diffusion depth into insulating film 205, that is, layer thickness of metal-diffused layers 205a, becomes enough thickness (almost 500 Å) as the conductive film. In this case, after ITO was diffused into insulating film 205 by sputtering ITO, when heat treatment is executed to heat again substrate 201 at almost 300° C., ITO can be diffused into insulating film 205 deeply so that layer thickness of metal-diffused layers 205a can be obtained satisfactorily.

After this step, ITO film A on diffusion preventive film 207 is removed by etching 207 with etching liquid consisting of components HCl:HNO$_3$:H$_2$O=1:0.08:1 at the temperature 35° C. When etching is done on the whole surface, the surfaces of diffusion preventive films 207 made of SiN recovers its insulating property by two minute etching so that metal-diffused layers 205a on contact hole areas in insulating film 205 are separated each other. In this case, both ITO films A on diffusion preventive film 207 and insulating film 205 are removed by etching. However, since metal-diffused layers 205a in insulating film 205 remain without being etched, the metal-diffused layer forming areas of insulating film 205 keep the conductivity of several KΩ of resistance value at the time when diffusion preventive films 207 again obtain its insulating property. ITO films A deposited on the bottom of contact holes 206, that is, source and drain electrodes S and D of thin film transistor T10, are also removed by whole surface etching. However, source and drain electrodes S and D remain without being etched. The lower edge surfaces of metal-diffused layers 205a are contacted conductively to source and drain electrodes S and D of thin film transistors T10. Accordingly, metal-diffused layers 205a act as contact layers which connect source and drain electrodes S and D of thin film transistors T10 to wirings 209 on insulating film 205.

Figure 21C:
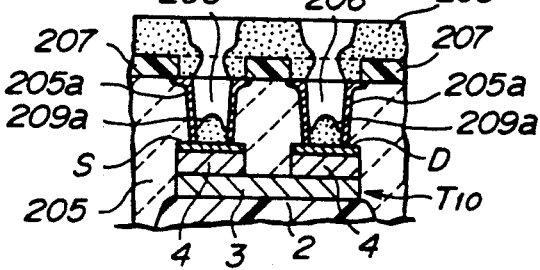

Conductive metal (for example, Al) is deposited by means of plating or sputtering process, and metal film which corresponds to wirings 209 is formed on diffusion preventive films 207 and insulating film 205, as shown in FIG. 21C. AT the same time, the metal is also deposited on the inner surfaces of contact holes 206 so as to form contact metal layers 209a on the inner bottoms of contact holes 206. Deposited thickness of the metal can be selected almost twice as thick as diffusion preventive films 207. More specifically, if the thickness of diffusion preventive films 207 is 1000 Å, the metal will be deposited 2000 Å in thickness. As a result, the metal can be deposited on the stepped portions between the surfaces of diffusion preventive films 207 and insulating film 205 in sufficient thickness, and the metal film which continues from diffusion preventive films 207 to insulating film 205 can be formed without disconnection. When the metal is deposited to such thickness, contact metal layers 209a deposited on contact holes 206 are contacted to source and drain electrodes S and D and to metal-diffused layers 205a on the inner surfaces of contact holes 206 with sufficient areas. Metal-diffused layers 205a which are contacted to source and drain electrodes S and D can be more firmly and conductivity connected to source and drain electrodes S and D. After this, the metal film deposited on diffusion preventive films 207 and insulating film 205 is patterned in order to form wirings 209 (source and drain wirings), as shown in FIG. 20. The patterning of the metal film can be easily done due to thin thickness of the metal film of almost 2000 Å and accordingly minute wirings 209 can also be formed.

More specifically, the wiring connection construction is made by the following steps. Conductive metal (ITO) is diffused into the contact hole forming areas so as to form metal-diffused layers 205a in the inner surface of contact holes 206 and the surfaces of the insulating film 205 in the peripheral areas of the contact holes. Parts of wirings 209 which are formed on insulating film 205 are overlapped on metal-diffused layers 205a in the peripheral areas of the contact holes 206 so as to connect conductively wirings 209 to metal-diffused layers 205a. At the same time when the metal corresponding to wirings 209 is deposited on insulating film 205, the metal is deposited on the inner bottoms of contact holes 206 so as to form contact metal layers 209a on the inner bottom of contact holes 206. As a result, metal-diffused layers 205a on the inner surfaces of the contact holes and source and drain electrodes S and D are firmly and conductively connected by means of contact metal layers 209a each other. Therefore, according to the wring connection construction, even if wirings 209 formed in insulating film 205 which covers thin film transistors T10 are connected to source and drain electrodes S and D in contact holes 206, wirings 209 are surely and conductively connected to source and drain electrodes S and D through conductive metal 205a, although wirings 209 on insulating film 205 and the metal corresponding to contact metal layers 209a in contact holes 206 are not deposited thickly. Conductive metal 205a is diffused into the contact hole forming areas of insulating film 205. According to the wiring connection construction, because deposited thickness of the metal which corresponds to wirings 209 and contact metal layers 209a can be made thin, deposit time of the metal can be shortened. Furthermore, the patterning of the deposited metal film corresponding to wirings 209 can be easily done and also fine wirings 209 are made possible. Incidentally, although the connection construction of the wirings which are connected to the source and drain electrodes of the inverted stagger type thin film transistor was described in the embodiment, the present invention also can be applicable to another transistors or ordinary transistors using Si single crystal substrate.

Figure 22:
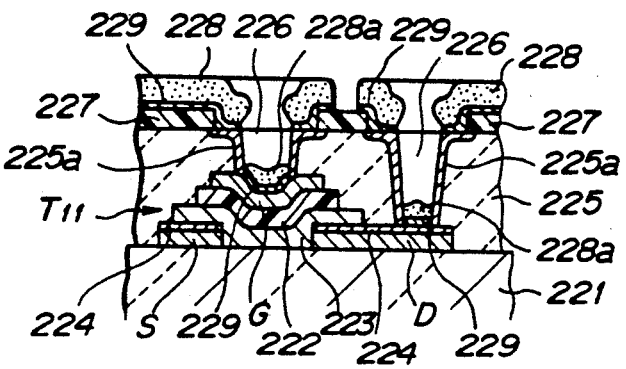
FIG. 22 is a schematic sectional view showing a pertinent portion of a thin film transistor panel according to still another embodiment of the present invention.
Figure 23:
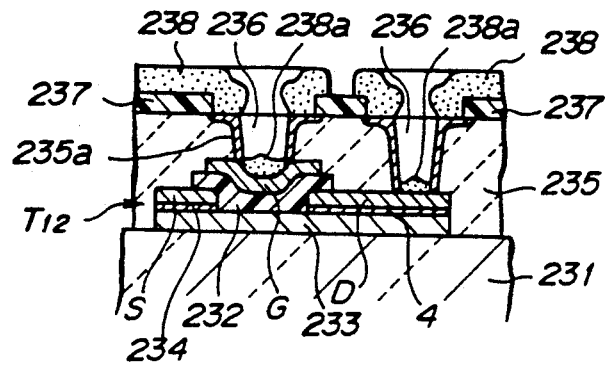
FIG. 23 is a schematic sectional view showing a pertinent portion of a thin film transistor panel according to still another embodiment of the present invention.
Figure 24:
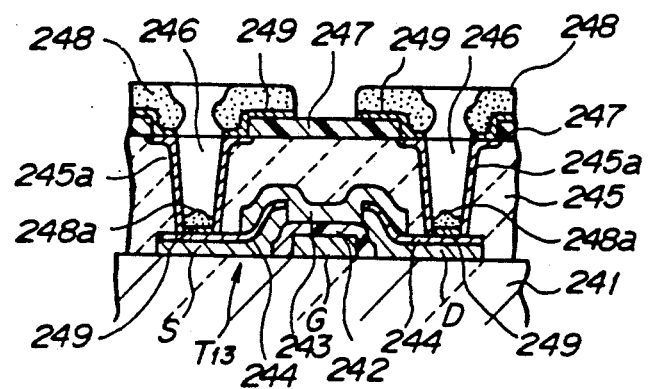
FIG. 24 is a schematic sectional view showing a pertinent portion of a thin film transistor panel according to still another embodiment of the present invention.

FIGS. 22 to 24 show the embodiments shown in FIGS. 8 to 10, respectively. More specifically, FIG. 22 shows the connection construction of the wirings 228 which are connected to gate and drain electrodes G and D of stagger type thin film transistor T11. FIG. 23 shows the connection construction of the wirings 228 which are connected to gate and drain electrodes G and D of coplanar type thin film transistor T12. FIG. 24 shows the connection construction of the wirings 228 which are connected to source and drain electrodes S and D of inverted coplanar type thin film transistor T13. Incidentally, the basic constructions of the embodiments shown in FIGS. 22 to 24 are identical to that of the embodiment shown in FIG. 7 and therefore the descriptions are omitted.

Figure 25:
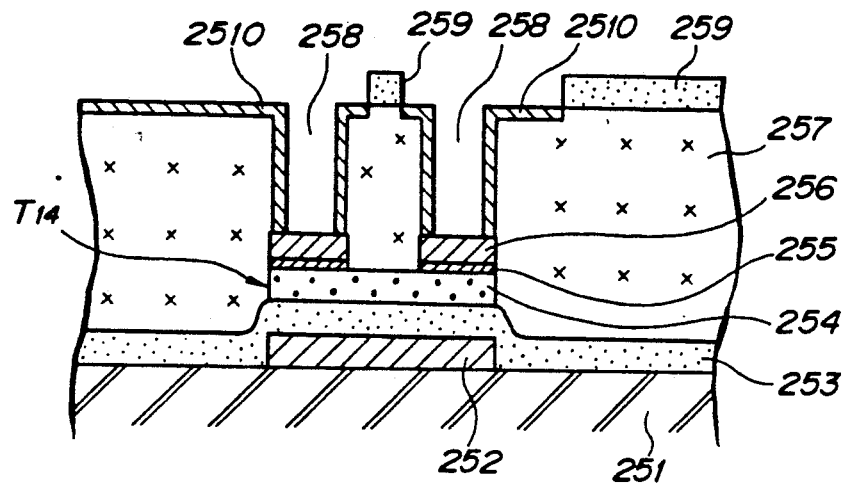
FIG. 25 is a schematic sectional view showing a pertinent portion of a thin film transistor panel according to still another embodiment of the present invention.

Another embodiment of a wiring connection of the thin film transistor panel of the present invention will be described below. FIG. 25 is schematic sectional view showing another embodiment of the present invention. Referring to FIG. 25, thin film transistor T14 is constituted by gate electrode 252 made of Cr etc., gate insulating layer 253 made of nitric silicon etc., a-Si semiconductor layer 254 made of a-Si (amorphous silicon), ohmic contact $n^+$-a-Si layers 255 in which n type impurity is doped at high density, and source and drain electrodes 256 made of Cr etc. on the insulating substrate 251 made of glass etc. Thin film transistor T14 is covered by thick insulating film 257 which is made of SOG and is almost 1 $\mu$m in thickness. Contact holes 258 are opened on source and drain electrodes 256. Furthermore, diffusion preventive layers 259 which is made of nitric silicon is formed on insulating film 257 by 1000 Å in thickness except for the areas of conductive layers 2510 described later. Conductive layers 2510 are formed in almost 500 Å thickness by diffusing a mixture of Sn, In and $O_2$ on the surfaces of insulating film 257 except for the areas of diffusion preventive layers 259 and on the surfaces of contact holes 258. More specifically, conductive layers 2510 are the wiring layers which connect source and drain electrodes 256 to the source and drain electrodes of other thin film transistors each other through contact holes 258 and insulating film 257.

Figure 26A:
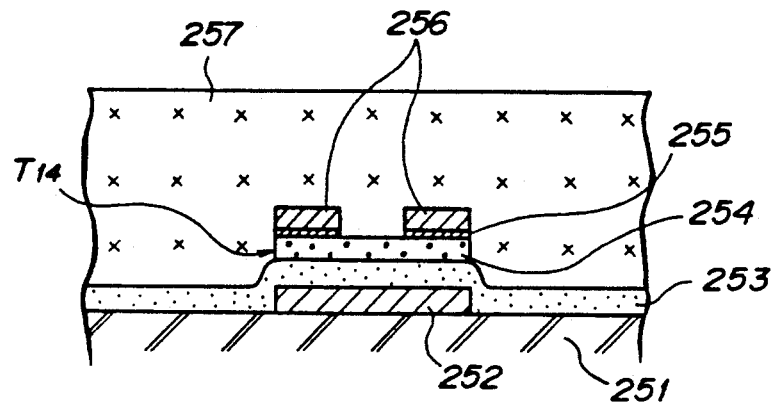
FIGS. 26A to 26D are schematic sectional views illustrating manufacturing steps of the thin film transistor panel according to the embodiment shown in FIG. 25.
Figure 26B:
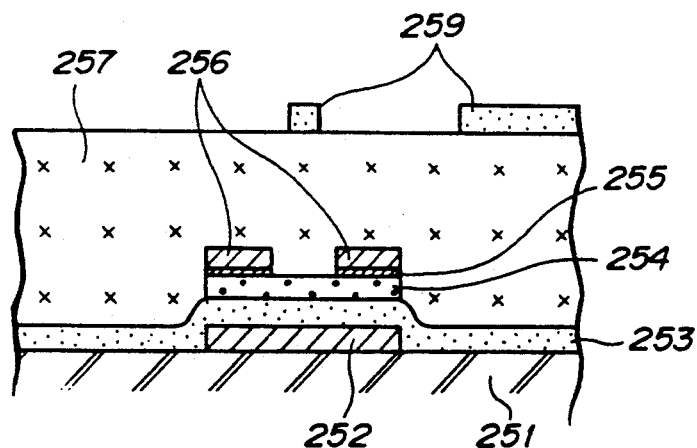
Figure 26C:
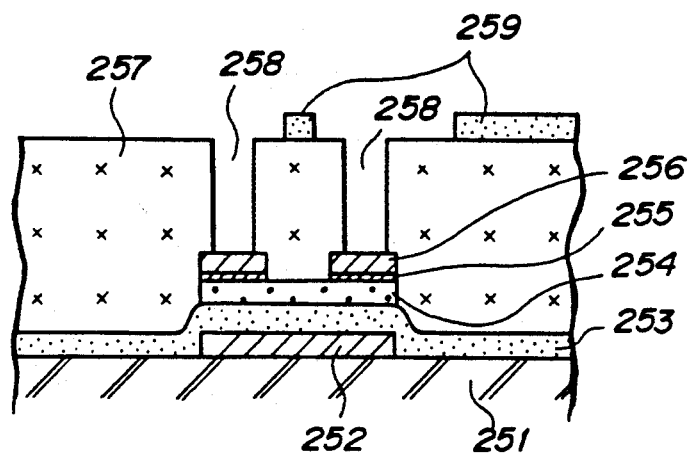
Figure 26D:
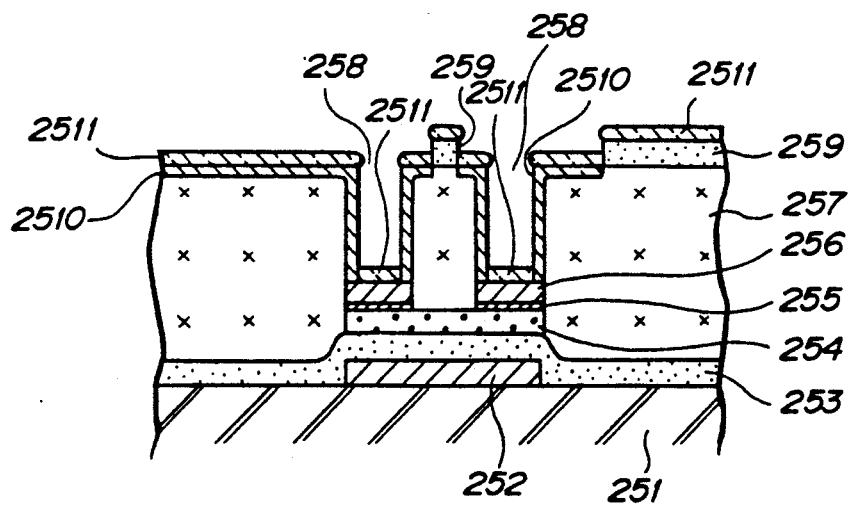

A method of manufacturing the wiring connection of such construction will be described below. First, as shown in FIG. 26A, thin film transistor T14 is formed on the insulating substrate 251 made of glass etc. Transistor T14 is composed of gate electrode 252, gate insulating layer 253, a-Si semiconductor layer 254, $n^+$-a-Si layers 255, and source and drain electrodes 256. Thereafter, insulating film 257 is made by applying SOG in almost 1 $\mu$m thickness on the whole surface and burning it. Then, the nitric silicon film of almost 1000 Å thickness is deposited on the whole surface of insulating film 257 by means of plasma CVD process and the like. As shown in FIG. 26B, the areas corresponding to conductive layers 2510 is removed by means of plasma etching etc. using, for example, $CF_4$ gas as etching gas so as to form diffusion preventive layers 259. Parts of insulating film 257 on source and drain electrodes 256 are removed by the etching process so as to open contact holes 258, as shown in FIG. 26C. After this, as shown in FIG. 26D, ITO film 2511 is deposited on the whole surface by means of sputtering process at, for example, 300° C. At the same time when ITO film 2511 is deposited, a mixture of Sn, In, $O_2$, is diffused into the surface areas of insulating film 257 made of SOG and conductive layers 2510 are formed in the diffused areas. However, diffusion can not be done in diffusion preventive layers 259 and thus the diffusion into the insulating film 257 under layers 259 can be prevented. Unless the depth of conductive layer 2510 is sufficient, heat treatment may be made again at almost 300° C. Conductive layers 2510 of almost 500 Å depth are formed in the surface areas except for areas under diffusion preventive layers 259 on insulating film 257 and the inner surface areas of contact holes 258 as above. Finally, ITO film on the whole surface is removed by wet etching with etching liquid consisting of components of, for example, $HCl:HNO_3:H_2O = 1:0.08:1$ at the temperature 35° C. Thus, diffusion preventive layers 259 recovers its insulating property for almost two minutes, but conductive layers 2510 can keep low resistance value of several K$\Omega$. According to the above steps, the wiring construction shown in FIG. 25 can be obtained.

According to the embodiment, the wiring layers (conductive layer 2510) can be simply formed by diffusing a mixture of Sn, In and $O_2$ on the surface of the insulating layer and the side surface of the contact holes. In addition, firm mutual connection can be obtained. As a result, it is not necessary to form the conventional thick metal layers as the wiring layers. Accordingly, since the time of depositing thick wiring layer is deleted, it is possible to shorten the manufacturing time. Also, since the technique of etching the thick wiring layers is not needed, it is possible to form the minute wirings.

Figure 27:
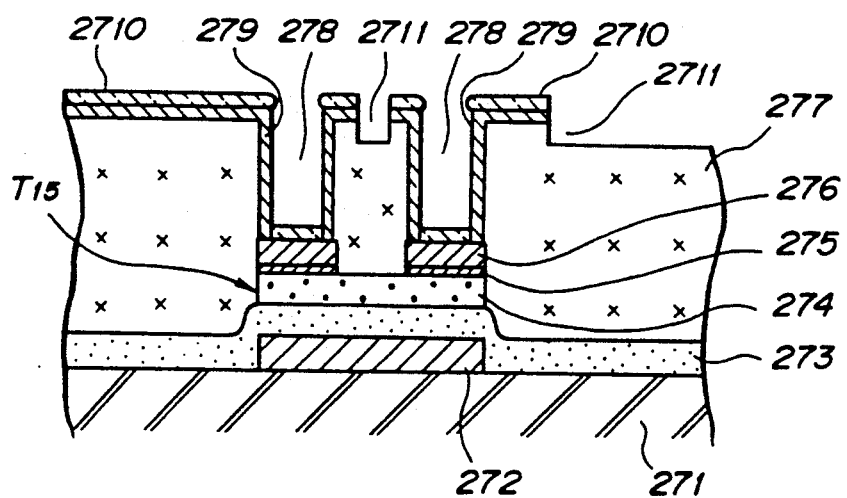
FIG. 27 is a schematic sectional view showing a pertinent portion of a thin film transistor panel according to still another embodiment of the present invention.

FIG. 27 is a schematic sectional view showing another embodiment of the present invention. In FIG. 27, concave portion 2711 in stead of diffusion preventive layer 259 in FIG. 25 is formed into the inside of insulating film 257. ITO layer 2710 is formed on conductive layer 279 on insulating layer 277 except for concave portion 2711 and on source and drain areas 276. More specifically, conductive layers 279 (and ITO layers 2710 thereon) are formed on the side surface of contact hole 278 and on the surface of insulating layer 277 from source and drain electrodes 276 to the electrodes of other thin film transistors. As a result, the wirings are completed. In order to obtain such wiring constructions, first contact holes 278 are formed and then ITO layer 2710 is formed on the whole surface. Conductive layers 279 are formed by means of diffusion on the whole surface of insulating layer 277 and on inner surfaces of contact holes 278. Processes of forming contact holes 278, ITO layers 2710 and conductive layers 279 are the same as the processes described above. Then, ITO films 2710 are removed by etching except for the wiring areas and the inner surfaces of contact holes 278. At that time, the etching is done by using such etching liquid consisting of components of, for example, $HCl:HNO_3:H_2O = 1:0.08:1$ at the temperature 35° C. After this, the surface of insulating layer 277 existing on the ITO layer 2710 removed area together with conductive layer 279 are removed by means of plasma etching which uses, for example, $CF_4$ gas as etching gas at RIE mode to thus form concave portion 2711. According to the above steps, the wiring construction shown in FIG. 27 can be obtained.

Accordingly, as in the embodiment in FIG. 25, the wiring layers (conductive layers 279) can be simply formed by means of diffusing into the surface of the insulating layer 277 and the inner surfaces of the contact holes 278. In addition, firm mutual connections can be obtained. As a result, it is not necessary to form the conventional thick metal layers as wiring layers. Furthermore, since according to the embodiment, the concave portions 2711 are removed by etching ITO layers 2710 and conductive layers 279 under layers 2710, it is not necessary to form diffusion preventive layers 259 as in FIG. 25 so that the manufacturing steps become simple. Incidentally, another insulating material can be used as insulating layer 277 in addition to the SOG even if it can give the conductivity to the surface areas by diffusing the metals. Also, the metals which are diffused into the surface areas of insulating layer 277 are not limited to a mixture of Sn, In and $O_2$. Furthermore, another diffusion preventive layer can be used besides SiN even if the material can prevent the diffusion of the metals.

What is claimed is:

1. A thin film transistor panel comprising:
    a transparent substrate;
    a plurality of mutually-insulated electrode lines arranged on the substrate and extending in row and column directions;
    a plurality of thin film transistors, with each being arranged on a part of the substrate which is in the vicinity of an intersection between given two electrode lines of said plurality of electrode lines, each thin film transistor of said plurality of thin film transistors having a gate electrode which is connected to one of said given two electrode lines, and drain and source electrodes one of which is connected to the other of said given two electrode lines;
    a transparent diffusible insulating film above the substrate and covering said plurality of thin film transistors; and
    metal-diffused layers which are transparent and conductive, and which include portions of said transparent diffusible insulating film and a metal diffused in said portions of said transparent diffusible insulating film, said metal-diffused layers being located in predetermined regions in correspondence with said plurality of thin film transistors, respectively, and being electrically connected to the other of said drain and source electrodes of the plurality of thin film transistors.

2. A thin film transistor panel according to claim 1, wherein said metal-diffused layers form pixel electrodes.

3. A thin film transistor panel according to claim 1, wherein said insulating film comprises SOG film.

4. A thin film transistor panel according to claim 1, wherein said metal-diffused layers are at surface regions of said transparent diffusible insulating film.

5. A thin film transistor panel according to claim 1, wherein said metal-diffused layers occupy substantially the entire thickness of the transparent diffusible insulating film.

6. A thin film transistor panel according to claim 1, wherein said transparent diffusible insulating film has the plurality of contact holes respectively positioned corresponding to said other of the drain and source electrodes of said plurality of thin film transistors, said other of the drain and source electrodes and said metal-diffused layers being electrically connected together through said contact holes.

7. A thin film transistor panel according to claim 1, wherein said transparent diffusible insulating film has a plurality of contact holes respectively positioned corresponding to at least one of the gate, drain and source electrodes of the plurality of thin film transistors, the at least one of the gate, drain and source electrodes and said metal-diffused layers being electrically connected together through said contact holes.

8. A thin film transistor panel according to claim 7, wherein said contact holes are formed on said source electrodes of said thin film transistors, and said metal-diffused layers are connected to said source electrodes.

9. A thin film transistor panel according to claim 7, wherein each of the metal-diffused layers is formed in the surface areas of said insulating film and the inner surfaces of said contact holes.

10. A thin film transistor panel according to claim 7, wherein said contact holes are bottomed holes.

11. A thin film transistor panel according to claim 7, wherein said contact holes are through holes.

12. A thin film transistor panel according to claim 7, further comprising:
    a diffusion-preventive film on those portions of the transparent diffusible insulating film which are other than said predetermined regions of the metal-diffused layers, for preventing diffusion of said metal;
    wirings on the diffusion preventive film and the metal-diffused layers arranged in a predetermined pattern and overlapping with said contact holes; and
    connecting means, located within the contact holes, for connecting the wiring with the electrodes of the plurality of thin film transistors.

13. A thin film transistor panel according to claim 12, wherein said connecting means includes the same metal as said wirings.

14. A thin film transistor panel according to claim 12, wherein said contact holes are formed correspondingly to two electrodes among gate, source and drain electrodes of said thin film transistors.

15. A thin film transistor panel comprising:
    a transparent substrate;
    a plurality of mutually-insulated electrode lines arranged on the substrate and extending in row and column directions;
    a plurality of thin film transistors, with each being arranged above that part of the substrate which is in the vicinity of an intersection between given two electrode lines of said plurality of electrode lines, each thin film transistor of said plurality of thin film transistors having a gate electrode which is connected to one of said given two electrode lines, and drain and source electrodes one of which is connected to the other of said given two electrode lines;
    a transparent diffusible insulating film on said substrate; and
    metal-diffused layers which are transparent and conductive, and which include portions of said transparent diffusible insulating film being located in correspondence to the plurality of thin film transistors, respectively, and a metal diffused in said portions, and being electrically connected to the other of said drain and source electrodes of the plurality of thin film transistors.

16. A thin film transistor panel according to claim 15, wherein said metal-diffused layers form pixel electrodes.

17. A thin film transistor panel according to claim 15, wherein said insulating film is made of SOG film.

18. A thin film transistor panel according to claim 15, wherein said plurality of thin film transistors are on the substrate, and said transparent diffusible insulating film is on those substrate portions which are other than regions where one of the gate, drain and source electrodes which is formed on the substrate is located.

19. A thin film transistor panel according to claim 15, wherein said transparent diffusible insulating film is substantially on the entire area of said substrate, and said plurality of thin film transistors are on the transparent diffusible insulating film.

20. An active matrix liquid crystal display device having a thin film transistor panel comprising:

a transparent substrate;

a plurality of mutually-insulated electrode lines arranged on the substrate and extending in row and column directions;

a plurality of thin film transistors, with each being arranged on a part of the substrate which is in the vicinity of an intersection between given two electrode lines of said plurality of electrode lines, each thin film transistor of said plurality of thin film transistors having a gate electrode which is connected to one of said given two electrode lines, and drain and source electrodes one of which is connected to the other of said given two electrode lines;

a transparent diffusible insulating film above the substrate and covering said plurality of thin film transistors;

metal-diffused layers which are transparent and conductive, and which include portions of the transparent diffusible insulating film being located in correspondence to the thin film transistors, respectively, and a metal diffused in said portions, and being electrically connected to the other of said drain and source electrodes of the plurality of thin film transistors;

an opposite substrate which opposes said substrate, with a predetermined gap therebetween;

at least one opposite electrode formed on that surface of said opposite substrate which opposes said substrate and arranged to face the metal-diffused layers; and a liquid crystal sealed between said substrate and said opposite substrate and having an optical characteristic which is variable in accordance with an electric field generated between the metal-diffused layer and the at least one opposite electrode.

21. A thin film transistor panel display device according to claim 20, wherein said metal-diffused layers form pixel electrodes.

22. A thin film transistor panel display device according to claim 20, wherein said substrate, said insulating film and said metal-diffused layers are transparent.

* * * * *

UNITED STATES PATENT AND TRADEMARK OFFICE
CERTIFICATE OF CORRECTION

PATENT NO.  : 5,084,905
DATED       : January 28, 1992
INVENTOR(S) : SASAKI et al It is certified that error appears in the above-identified patent and that said Letters Patent is hereby corrected as shown below:

TITLE PAGE:

Under Section [30] Foreign Application Priority Data, insert the following:

--April 26, 1989 [JP] Japan.......1-49015[U]--

Under Section [56] References Cited, insert the following references under "U.S. Patent Documents":

3,765,747   10/1973   Pankratz et al
3,840,695   10/1974   Fischer
3,862,360    1/1975   Dill et al
4,821,092    4/1989   Noguchi Signed and Sealed this Twenty-second Day of June, 1993

Attest:

MICHAEL K. KIRK

*Attesting Officer*  *Acting Commissioner of Patents and Trademarks*